(12) United States Patent
Oh et al.

(10) Patent No.: US 10,692,555 B2
(45) Date of Patent: Jun. 23, 2020

(54) SEMICONDUCTOR MEMORY DEVICES ENABLING READ STROBE MODE AND RELATED METHODS OF OPERATING SEMICONDUCTOR MEMORY DEVICES

(71) Applicant: Samsung Electronics Co., Ltd., Suwon-si (KR)

(72) Inventors: Ki-Seok Oh, Seoul (KR); Seong-Hwan Jeon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/249,594

(22) Filed: Jan. 16, 2019

(65) Prior Publication Data

US 2019/0172512 A1 Jun. 6, 2019

Related U.S. Application Data

(63) Continuation-in-part of application No. 15/624,491, filed on Jun. 15, 2017, now Pat. No. 10,186,309.

(30) Foreign Application Priority Data

Jun. 29, 2016 (KR) .......................... 10-2016-0081276
Aug. 8, 2016 (KR) .......................... 10-2016-0100453

(51) Int. Cl.
*G11C 8/18* (2006.01)
*G11C 7/22* (2006.01)
(Continued)

(52) U.S. Cl.
CPC .............. *G11C 8/18* (2013.01); *G11C 7/1006* (2013.01); *G11C 7/1009* (2013.01);
(Continued)

(58) Field of Classification Search
CPC ....................................................... G11C 8/18
(Continued)

(56) References Cited

U.S. PATENT DOCUMENTS 6,215,710 B1 4/2001 Han et al.
7,269,699 B2 9/2007 Jang
(Continued)

FOREIGN PATENT DOCUMENTS

KR 2000-0027381 A 5/2000
KR 2009-0026276 A 3/2009
(Continued)

*Primary Examiner* — Hoai V Ho
(74) *Attorney, Agent, or Firm* — Muir Patent Law, PLLC

(57) ABSTRACT

A method of operating a semiconductor memory device including a plurality of pins configured to transfer data and signals from/to an outside of the semiconductor memory device, a memory cell array and a control logic circuit to control access to the memory cell array. A write command synchronized with a main clock signal and data synchronized with a data clock signal are received from outside of the semiconductor memory device, the data is stored in the memory cell array based on a frequency-divided data clock signal, data is read from the memory cell array in response to a read command and a target address received from the outside of the semiconductor memory device, and the read data is transmitted to the outside of the semiconductor memory device selectively with a strobe signal generated based on a frequency of the main clock signal.

20 Claims, 25 Drawing Sheets

(51) Int. Cl.
  *G11C 7/10* (2006.01)
  *G11C 11/4096* (2006.01)
  *G11C 11/4076* (2006.01)
  *G11C 29/12* (2006.01)
  *G11C 29/02* (2006.01)
  *G11C 29/10* (2006.01)
  *G11C 8/12* (2006.01)

(52) U.S. Cl.
  CPC .......... *G11C 7/1045* (2013.01); *G11C 7/1066* (2013.01); *G11C 7/1069* (2013.01); *G11C 7/1072* (2013.01); *G11C 7/1093* (2013.01); *G11C 7/1096* (2013.01); *G11C 7/222* (2013.01); *G11C 11/4076* (2013.01); *G11C 11/4096* (2013.01); *G11C 29/021* (2013.01); *G11C 29/028* (2013.01); *G11C 29/10* (2013.01); *G11C 29/1201* (2013.01); *G11C 29/12015* (2013.01); *G11C 8/12* (2013.01); *G11C 2207/108* (2013.01); *G11C 2207/2254* (2013.01)

(58) Field of Classification Search
  USPC ...................................................... 365/233.1
  See application file for complete search history.

(56) References Cited

U.S. PATENT DOCUMENTS

| | | | |
|---|---|---|---|
| 7,990,777 | B2 | 8/2011 | Rha |
| 8,019,907 | B2 | 9/2011 | Talbot |
| 8,086,813 | B2 | 12/2011 | Gillingham et al. |
| 8,284,621 | B2 | 10/2012 | Dreps et al. |
| 8,347,198 | B2 | 1/2013 | Shin et al. |
| 8,423,700 | B2 | 4/2013 | Panabaker et al. |
| 8,713,231 | B2 | 4/2014 | Nishioka et al. |
| 9,300,282 | B2 | 3/2016 | Kim et al. |
| 10,186,309 | B2 * | 1/2019 | Oh ...................... G06F 11/1004 |
| 2014/0043925 | A1 | 2/2014 | Lin et al. |
| 2014/0140145 | A1 | 5/2014 | Taruishi et al. |

FOREIGN PATENT DOCUMENTS

| | | |
|---|---|---|
| KR | 2009-0035508 A | 4/2009 |
| KR | 2009-0059838 A | 6/2009 |

* cited by examiner

240A

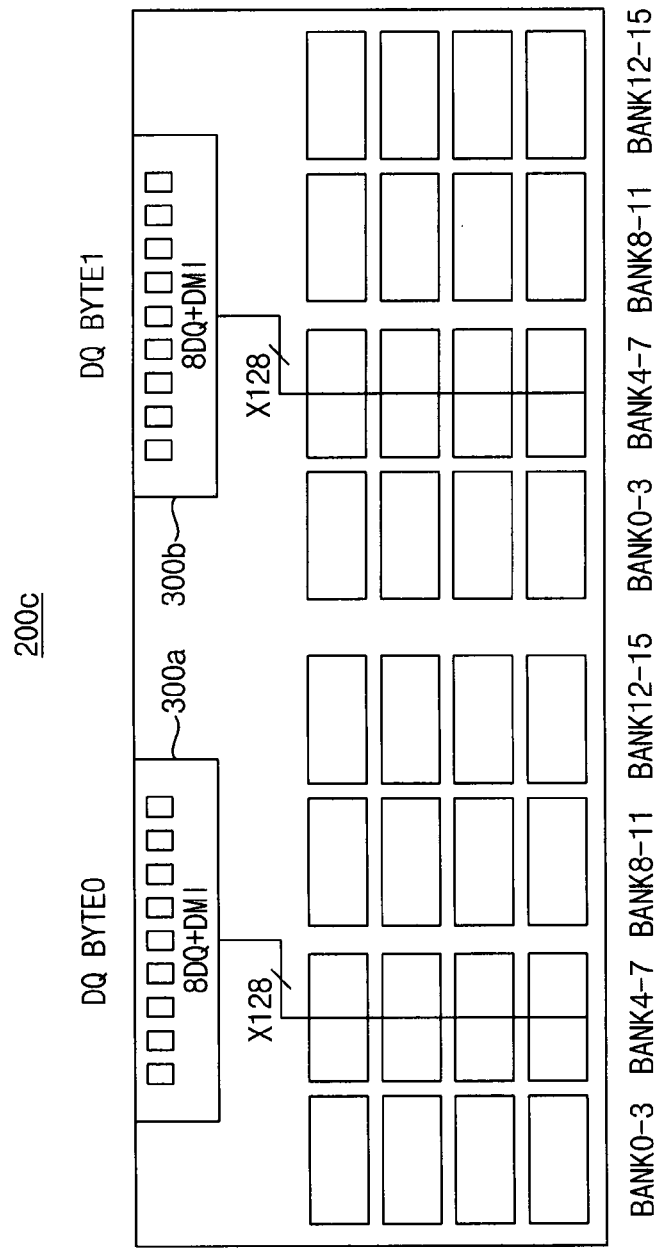

FIG. 17

| PIN | MR20 OP[7] | DQ INVERT | DQ OUTPUT DATA fix0 | BIT SEQUENCE | | | | | | | | | | | | | | | |
|---|---|---|---|---|---|---|---|---|---|---|---|---|---|---|---|---|---|---|---|
| | | | | 15 | 14 | 13 | 12 | 11 | 10 | 9 | 8 | 7 | 6 | 5 | 4 | 3 | 2 | 1 | 0 |
| DQx | 0 | YES | - | 1 | 0 | 1 | 0 | 0 | 1 | 1 | 0 | 1 | 1 | 1 | 0 | 0 | 0 | 1 | 0 |
| | 0 | NO | - | 0 | 1 | 0 | 1 | 1 | 0 | 0 | 1 | 0 | 0 | 0 | 1 | 1 | 0 | 1 | 1 |
| | 1 | - | YES | 0 | 0 | 0 | 0 | 0 | 0 | 0 | 0 | 0 | 0 | 0 | 0 | 0 | 0 | 0 | 0 |
| | 1 | - | NO | 0 | 1 | 0 | 1 | 1 | 0 | 0 | 1 | 0 | 0 | 0 | 1 | 1 | 1 | 0 | 0 |

FIG. 18

| PIN | MR20 OP[6] | DQ OUTPUT DATA fix0 | BIT SEQUENCE | | | | | | | | | | | | | | | |
|---|---|---|---|---|---|---|---|---|---|---|---|---|---|---|---|---|---|---|
| | | | 15 | 14 | 13 | 12 | 11 | 10 | 9 | 8 | 7 | 6 | 5 | 4 | 3 | 2 | 1 | 0 |
| DMI | 0 | YES | 0 | 1 | 0 | 1 | 1 | 0 | 0 | 1 | 0 | 0 | 0 | 1 | 1 | 1 | 1 | 0 |
| | 1 | NO | 0 | 0 | 0 | 0 | 0 | 0 | 0 | 0 | 0 | 0 | 0 | 0 | 0 | 0 | 0 | 0 |

SEMICONDUCTOR MEMORY DEVICES ENABLING READ STROBE MODE AND RELATED METHODS OF OPERATING SEMICONDUCTOR MEMORY DEVICES

CROSS-REFERENCE TO RELATED APPLICATION(S)

This application is a continuation-in-part of and claims priority to U.S. patent application Ser. No. 15/624,491 filed on Jun. 15, 2017, which claims priority to Korean Patent Application No. 10-2016-0081276, filed on Jun. 29, 2016 and Korean Patent Application No. 10-2016-0100453, filed on Aug. 8, 2016 in the Korean Intellectual Property Office, the disclosure of each of which is incorporated herein by reference in its entirety.

BACKGROUND

1. Technical Field

Exemplary embodiments relate to memory devices, and more particularly to methods of operating semiconductor memory devices and semiconductor memory devices.

2. Discussion of the Related Art

Dynamic random access memory (DRAM) may receive a command and an address in synchronization with a main clock signal CK. The DRAM may also receive or transmit data in synchronization with a data clock signal WCK. A DRAM performs two main operations. These include an operation of writing data in a memory cell array included in a core circuit and an operation of reading the data from the memory cell array.

Recently, the DRAM which operates with a high frequency, may transmit a strobe signal along with data to a memory controller in a read operation of the DRAM.

SUMMARY

Some exemplary embodiments provide method of operating a semiconductor memory device, capable of supporting a data strobe mode when the semiconductor memory device operates based on a data clock signal.

Some exemplary embodiments provide a semiconductor memory device, capable of supporting a data strobe mode when the semiconductor memory device operates based on a data clock signal.

According to exemplary embodiments, a method of operating a semiconductor memory device including a plurality of pins configured to transfer data and signals from/to an outside of the semiconductor memory device, a memory cell array and a control logic circuit configured to control access to the memory cell array, the control logic circuit including a mode register set configured to set an operation mode of the semiconductor memory device is provided. A write command synchronized with a main clock signal and data synchronized with a data clock signal are received from the outside of the semiconductor memory device, the data is stored in the memory cell array based on a frequency-divided data clock signal which is divided from the data clock signal, data is read from the memory cell array in response to a read command and a target address from the outside of the semiconductor memory device, and the read data is transmitted to the outside of the semiconductor memory device selectively with a strobe signal generated based on a frequency of the main clock signal.

According to exemplary embodiments, a semiconductor memory device includes a plurality of pads disposed on a substrate, a memory cell array, a control logic circuit and an input/output (I/O) circuit. The memory cell array stores write data which is synchronized with a data clock signal received from an outside of the semiconductor memory device in a write operation of the semiconductor memory device. The control logic circuit controls access to the memory cell array in response to a command and an address received from the outside of the semiconductor memory device, the command and the address being synchronized with a main clock signal received from the outside of the semiconductor memory device, and the control logic circuit includes a mode register set to set an operation mode of the semiconductor memory device. The I/O circuit transmits read data from the memory cell array to the outside of the semiconductor memory device selectively with a strobe signal generated based on a frequency of the main clock signal.

Accordingly, a semiconductor memory device and a memory system using a main clock signal and a data clock signal support a read data strobe mode in which a single-ended strobe signal or a differential strobe signal is used, and performance of the semiconductor memory device may be enhanced.

BRIEF DESCRIPTION OF THE DRAWINGS

Illustrative, non-limiting exemplary embodiments will be more clearly understood from the following detailed description taken in conjunction with the accompanying drawings.

FIG. 4B through 4D illustrate examples of the memory cell array in the semiconductor memory device of FIG. 3 according to exemplary embodiments, respectively.

FIG. 17 illustrates an example of bits output through the data pins in the read data calibration mode and FIG. 18 illustrates an example of bits output through a data mask inversion DMI pad in the read data calibration mode.

DETAILED DESCRIPTION

Various exemplary embodiments will be described more fully hereinafter with reference to the accompanying drawings, in which some exemplary embodiments are shown.

Figure 1:
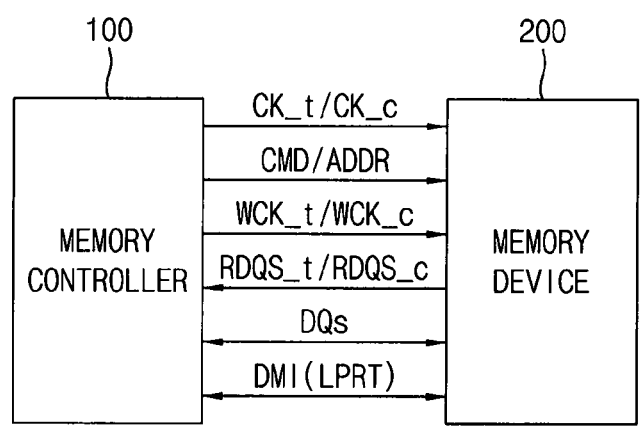
FIG. 1 is a block diagram illustrating a memory system according to exemplary embodiments.

FIG. 1 is a block diagram illustrating a memory system according to exemplary embodiments.

Referring to FIG. 1 a memory system 10 may include a memory controller 100 and a semiconductor memory device 200.

The memory controller 100 may control overall operation of the semiconductor memory device 200.

The memory controller 100 transmits command/address CMD/ADDR to the semiconductor memory device 200 in synchronization with a differential clock signal CK_t/CK_c including a main clock signal CK_t and a complementary (or, inverted) main clock signal CK_c. The memory controller 100 transmits data DQs to the semiconductor memory device 200 in synchronization with a differential data clock signal WCK_t/WCK_c including a data clock signal WCK_t and a complementary (or, inverted) data clock signal WCK_c.

The semiconductor memory device 200 transmits the data DQs to the memory controller 100 in an access mode (e.g., a read mode or a write mode). The semiconductor memory device 200 transmits the data DQs to the memory controller 100 without a strobe signal in a non-strobe mode (or, the access mode) and transmits the data DQs to the memory controller 100 in synchronization with one of a single-ended strobe signal (or, a first strobe signal) RDQS_t and a differential strobe signal RDQS_t/RDQS_c having the first strobe signal RDQS_t and a complementary (or, inverted) strobe signal (or, a second strobe signal) RDQS_c in a strobe mode.

The memory controller 100 and the semiconductor memory device 200 may exchange a data mask inversion signal DMI or link parity signal LPRT. The data mask inversion signal DMI may indicate whether the data DQs is masked or inverted and the link parity signal LPRT may be used for detecting and/or correction transmission error which may occur during the data DQs is transmitted.

Each of the memory controller 100 and the semiconductor memory device 200 may include a plurality of signal chip pads on a substrate (not shown). The signal chip pads are connected to internal circuitry (e.g., appropriate I/O buffers, internal clock generators, latches, etc.) of a chip to send and/or receive information or timing control (such as data, address and control information and clock signals) with respect to an external source (e.g., another chip or device).

When each of the memory controller 100 and the semiconductor memory device 200 is formed in a package, a plurality of pins of the memory controller 100 and a plurality of pins of the semiconductor memory device 200 are connected with each other. The plurality of signal chip pads of the memory controller 100 are connected with the plurality of pins of the memory controller 100. The plurality of signal chip pads of the semiconductor memory device 200 are connected with the plurality of pins of the semiconductor memory device 200.

The semiconductor memory device 200 may be a dynamic random access memory (DRAM), such as a low power double data rate (LPDDR) 5 synchronous dynamic random access (SDRAM), etc.

The memory controller 100 may designate one of the access mode and the strobe mode of the semiconductor memory device 200 using the command CMD and the address ADDR.

Figure 2A:
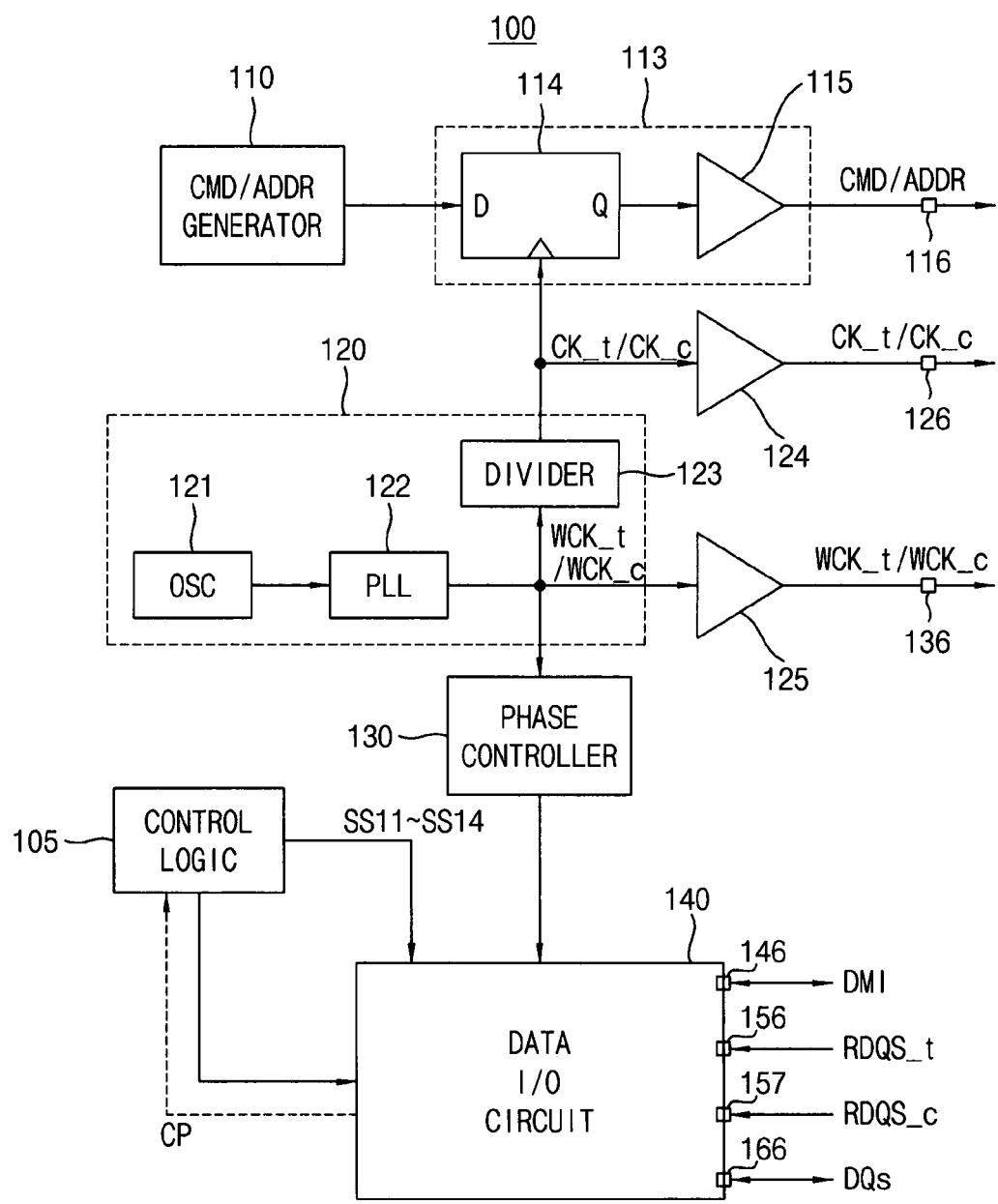
FIG. 2A is a block diagram illustrating the memory controller in the memory system of FIG. 1 according to exemplary embodiments.

FIG. 2A is a block diagram illustrating the memory controller in the memory system of FIG. 1 according to exemplary embodiments.

Referring to FIG. 2, the memory controller 100 may include a control logic 105, a command/address generator 110, a command/address transmission circuit 113, a clock signal generator 120, a clock signal transmitter 124, a data clock signal transmitter 125, a phase controller 130, and a data input/output (I/O) circuit 140.

The control logic 105 may control the data I/O circuit 140 and may provide selection signals SS11~SS14 to the data I/O circuit 140.

The command/address generator 110 generates the command CMD and the address ADDR and provides the command CMD and the address ADDR to the command/address transmission circuit 113. The command/address transmission circuit 113 includes a sampler 114 and a transmitter 115. The sampler 114 provides the command CMD and the address ADDR to the sampler 114 in synchronization with the clock signal CK and the transmitter 115 transmits the command CMD and the address ADDR to the semiconductor memory device 200 through a pad 116.

The clock signal generator 120 includes an oscillator 121, a phase-locked loop (PLL) circuit 122 and a divider 123. The oscillator 121 generates oscillation signal to provide the oscillation signal to the PLL circuit 122. The PLL circuit 122 generates the differential data clock signal WCK_t/WCK_c in response to the oscillation signal and provides the differential data clock signal WCK_t/WCK_c to the divider 123, the data clock signal transmitter 125 and the phase controller 130.

The data clock signal transmitter 125 transmits the differential data clock signal WCK_t/WCK_c to the semiconductor memory device 200 through a pad 136. The divider 123 divides a frequency of the differential data clock signal WCK_t/WCK_c to generate the differential clock signal CK_t/CK_c. The divider 123 provides the differential clock signal CK_t/CK_c to the clock signal transmitter 124 and the clock signal transmitter 124 transmits the differential clock signal CK_t/CK_c to the semiconductor memory device 200 through a pad 126.

The phase controller 130 adjusts a phase of the differential data clock signal WCK_t/WCK_c to provide the phase-adjusted differential data clock signal to the data I/O circuit 140.

The data I/O circuit 140 may exchange the data mask inversion signal DMI with the semiconductor memory device 200 through a pad 146, may receive the strobe signals RDQS_t and RDQS_c from the semiconductor memory device 200 through pads 156 and 157, and may exchange the data DQs with the semiconductor memory device 200 through a pad 166. The data I/O circuit 140 may provide a calibration pattern CP to the control logic 105 in a read data calibration mode.

Figure 2B:
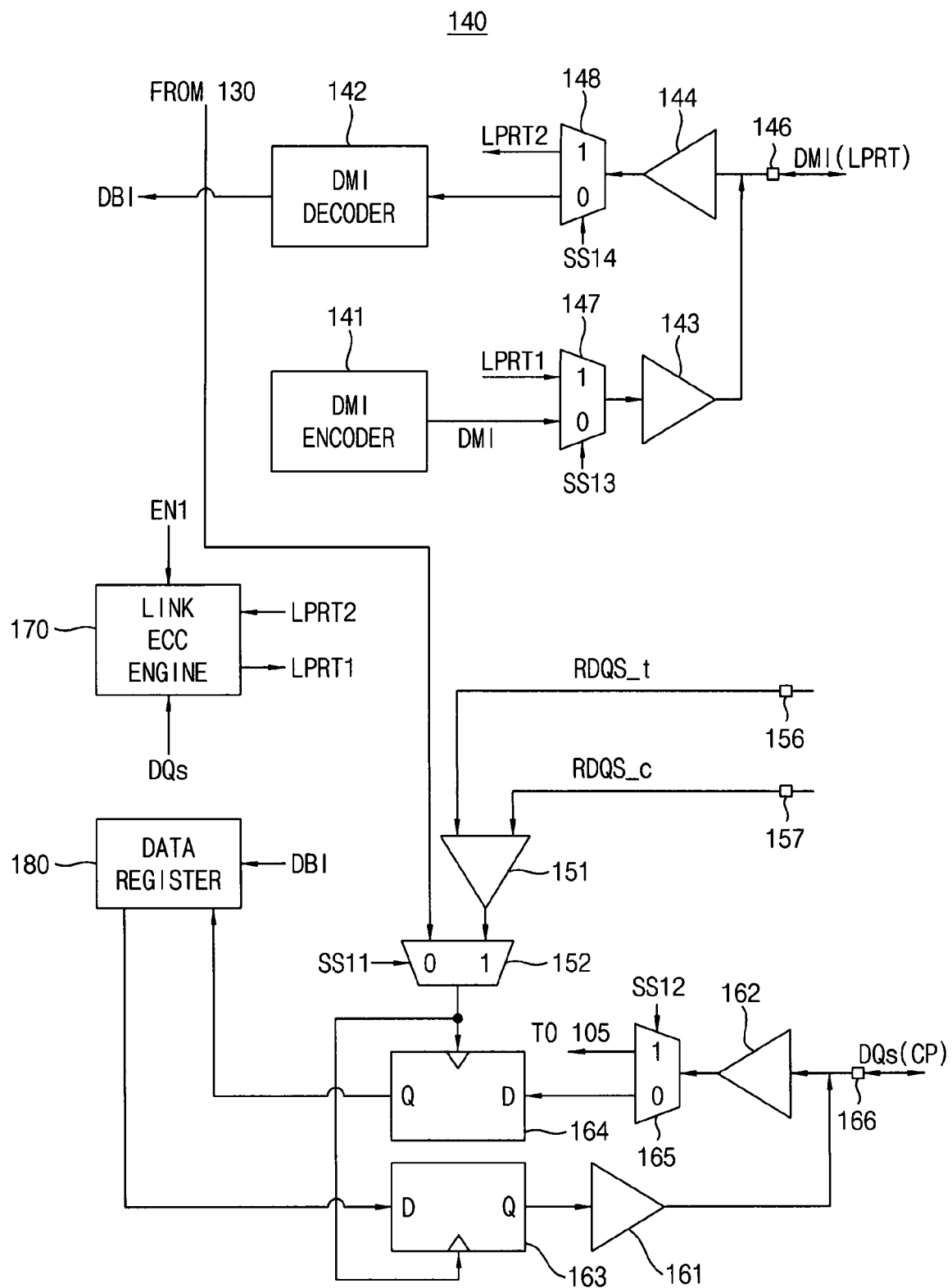
FIG. 2B illustrates an example of the data I/O circuit in FIG. 2A according to exemplary embodiments.

FIG. 2B illustrates an example of the data I/O circuit in FIG. 2A according to exemplary embodiments.

Referring to FIG. 2B, the data I/O circuit 140 may include a DMI encoder 141, a DMI decoder 142, a multiplexer 147, a demultiplexer 148, a DMI transmitter 143, a DMI receiver 144, a comparator 151, a multiplexer 152, a data receiver 162, a data transmitter 161, a first sampler 163, second sampler 164, a demultiplexer 165, a link error correction code (ECC) engine 170 and a data register 180.

The DMI encoder 141 may generate the data mask inversion signal DMI indicating whether the write data is masked or inverted. The multiplexer 147 may select one of the data mask inversion signal DMI and a first link parity LPRT1 in response to the selection signal SS13, and the DMI transmitter 143 may transmit an output of the multiplexer 147 to the semiconductor memory device 200 through the pad 146.

The DMI receiver 144 may receive the data mask inversion signal DMI from the semiconductor memory device 200 and the demultiplexer 148 may provide the data mask inversion signal DMI to the DMI decoder 142 or may output a second link parity LPRT2 in response to the selection signal SS14. The DMI decoder 142 may decode an output of the demultiplexer 148 and may provide data inversion information DBI to the data register 180.

The link ECC engine 170 may be selectively enabled in response to an enable signal EN1, may generate the first link parity LPRT1 in a write operation, may receive the second link parity LRPT2 to detect and/or correct the transmission error of the data DQs based on the second link parity LRPT2 in a read operation.

The comparator 151 may receive the strobe signals RDQS_t and RDQS_c and may compare the strobe signals RDQS_t and RDQS_c to output a comparison result. The multiplexer 152 may select one of an output of the comparator 151 and an output of the phase controller 130 and may provide a selected one to the first and second samplers 163 and 164. The multiplexer 152 selects the output of the phase controller 130 in the access mode and selects the output of the comparator 151 in the strobe mode.

The first sampler 163 transmits the data DQs from the data register 180 to the semiconductor memory device 200 through the data transmitter 161 in synchronization with the phase-adjusted differential data clock signal in the access mode and transmits the data DQs from the data register 180 to the semiconductor memory device 200 through the data transmitter 161 in synchronization with the output of the comparator 151 in the strobe mode. The data transmitter 1612 transmits data DQs to the semiconductor memory device 200 through the pad 166.

The second sampler 164 provides the data DQs from the data receiver 162 to the data register 180 in synchronization with the phase-adjusted differential data clock signal in the access mode and provides the data DQs from the data receiver 162 to the data register 180 in synchronization with the output of the comparator 151 in the strobe mode. The data receiver 162 receives data DQs from the semiconductor memory device 200 through the pad 166 (e.g., data I/O pad, or DQ pad).

Each of the first sampler 163 and the second sampler 164 may include a D flip-flop.

The data register 180 may selectively invert the data DQs based on the data inversion information DBI in the read operation.

The control logic 105 may control overall operation of the memory controller 100.

Figure 3:
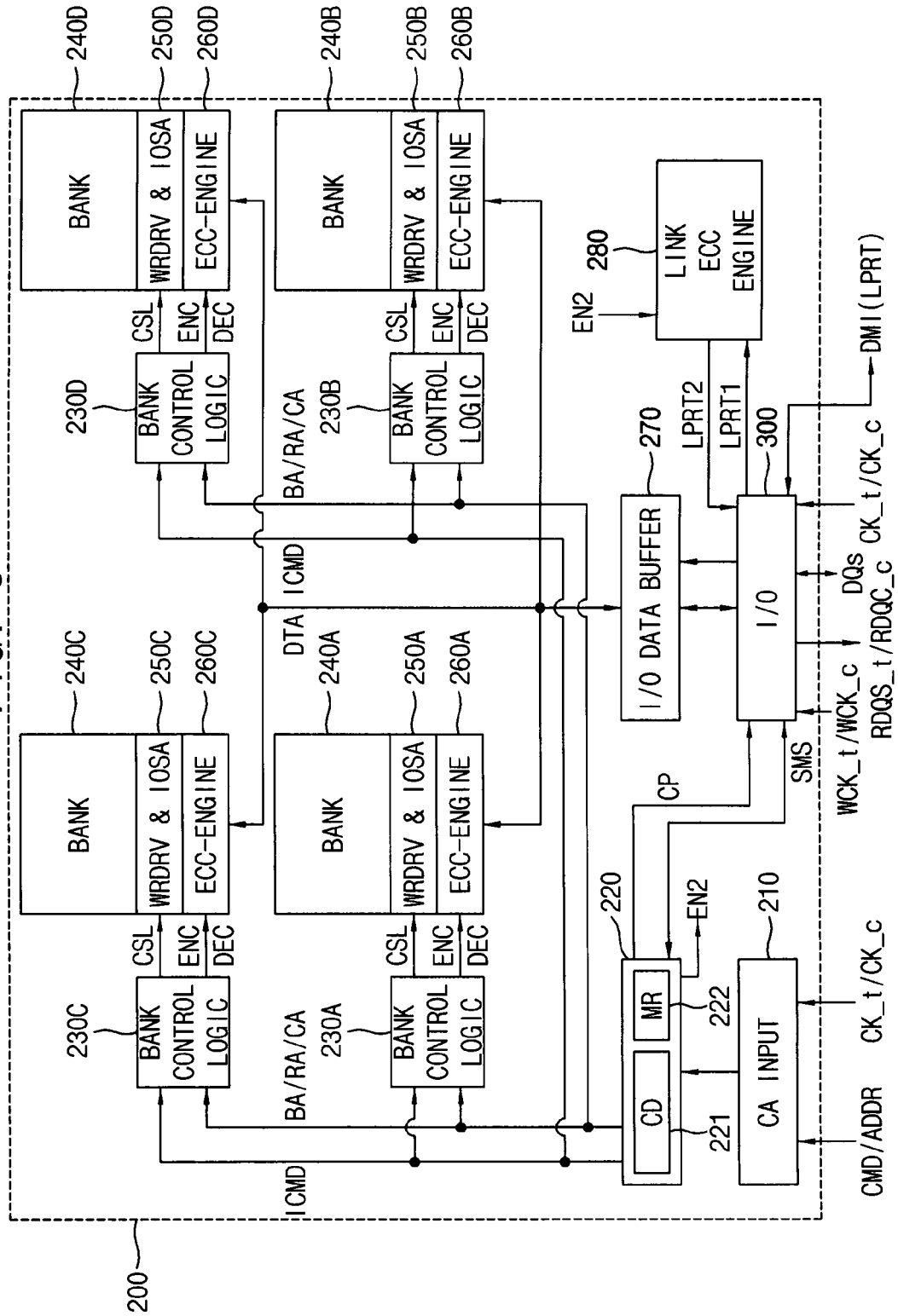
FIG. 3 is a block diagram illustrating the semiconductor memory device in the memory system of FIG. 2 according to exemplary embodiments.

FIG. 3 is a block diagram illustrating the semiconductor memory device in the memory system of FIG. 2 according to exemplary embodiments.

Referring to FIG. 3, the semiconductor memory device 200 may include a command/address input buffer 210, a control logic circuit 220, bank control logics 230A~230D, memory cell arrays 240A~240D, write driver and data input/output (I/O) sense amplifiers 250A~250D, error correction code (ECC) engines 260A~260D, an I/O data buffer 270, a link ECC engine 280 and an I/O circuit 300.

The memory cell arrays 240A~240D may include first through fourth bank arrays 240A~240D, respectively, in which a plurality of memory cells are arranged in rows and columns. A row decoder and a column decoder for selecting word-lines and bit-lines that are connected to the memory cells may be connected to each of the first through fourth bank arrays 240A~240D. In the exemplary embodiment, the semiconductor memory device 200 includes the four banks, but in other embodiments, the semiconductor memory device 200 may include an arbitrary number of banks.

The command/address input buffer 210 may receive the differential clock signal CK_t/CK_c, the command CMD, and the address ADDR from the memory controller 100. The command CMD and the address ADDR may be input via the same terminals, i.e., CA pads. The command CMD and the address ADDR may be sequentially input via the CA pads.

The control logic circuit 220 may receive the command CMD and the address ADDR via the command/address input buffer 210, and may generate an internal command ICMD, a strobe mode signal SMS and an address signal. The internal command ICMD may include an internal read command and an internal write command. The address signal may include a bank address BA, a row address RA, and a column address CA. The internal command ICMD and the address signal BA/RA/CA may be provided to each of the bank control logics 230A~230D. The control logic circuit 220 may control access to the memory cell arrays 240A~240D.

The control logic circuit 220 may include a command decoder 221 and a mode register set 222. The command decoder 221 decodes the command CMD to generate the internal command ICMD and the mode register set 222 may set an operation mode of the semiconductor memory device 200 based on the command CMD and the address ADDR. The mode register set 222 may include a plurality of mode registers that set the access mode or the strobe mode of the semiconductor memory device 200 based on the command CMD and the address ADDR. The mode register set 222 may provide the I/O circuit 300 with a strobe mode signal SMS indicating one of the access mode and the strobe mode.

In addition, the mode register set 222 may provide the I/O circuit 300 with the calibration pattern CP stored therein.

Each of the bank control logics 230A~230D may be activated while corresponding to the bank address BA. The activated bank control logics 230A~230D may generate bank control signals in response to the internal command ICMD, the row address RA, and the column address CA. In response to the bank control signal, the row decoder and the column decoder of each of the first through fourth bank arrays 240A~240D that are connected to the activated bank control logics 230A~230D may be activated.

The row decoder of each of the first through fourth bank arrays 240A~240D may decode the row address RA and therefore may enable a word-line that corresponds to the row address RA. The column address CA of each of the first through fourth bank arrays 240A~240D may be temporarily stored in a column address latch. The column address latch may stepwise increase the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signal, each of the bank control logics 230A~230D may generate an ECC encoding signal ENC and an ECC decoding signal DEC for controlling operations of the ECC engines 260A~260D that are connected to the first through fourth bank arrays 240A~240D, respectively.

The write driver and data I/O sense amplifiers 250A~250D may sense and amplify a plurality of pieces of read data output from the first through fourth bank arrays 240A~240D, respectively, and may transmit a plurality of pieces of write data DTA to be stored in the first through fourth bank arrays 240A~240D, respectively.

During the write operation, each of the ECC engines 260A~260D may generate parity bits by performing an ECC encoding operation on the plurality of pieces of write data to be stored in each of the first through fourth bank arrays 240A~240D, in response to the ECC encoding signal ENC output from each of the bank control logics 230A~230D.

During the read operation, each of the ECC engines 260A~260D may perform an ECC decoding operation by using the plurality of pieces of data DTA and parity bits that are read from each of the first through fourth bank arrays 240A~240D, in response to the ECC decoding signal DEC output from each of the first through fourth bank arrays 240A~240D, and therefore may detect and correct an error bit occurred in the plurality of pieces of read data.

The I/O data buffer 270 may include circuits for gating a plurality of pieces of data that are input to or output from the first through fourth bank arrays 240A~240D, read data latch circuits for storing the plurality of pieces of data output from the first through fourth bank arrays 240A~240D, and write data latch circuits for writing the plurality of pieces of data to the first through fourth bank arrays 240A~240D.

The I/O data buffer 270 may convert parallel data bits that are output from the first through fourth bank arrays 240A~240D into serial data bits via the read data latches. The I/O data buffer 270 may convert a plurality of pieces of write data that are serially received into parallel data bits by using the write data latches.

The link ECC engine 280 may be selectively activated in response to an enable signal EN2 received from the control logic circuit 220. When the link ECC engine 280 is activated, the link ECC engine 280 may detect and/or correct of transmission error of the data DQs based on the first link parity LPRT1 in the write operation and may generate the second link parity LPRT2 in the read operation.

The I/O circuit 300 may receive the serial data bits output from the I/O data buffer 270, may sequentially array the serial data bits as data bits that correspond to a burst length, and then may output together the data bits and the strobe signal RDQS or the differential strobe signal RDQS_t/RDQS_c to data I/O pads. The I/O circuit 300 may receive the differential data clock signal WCK_t/WCK_c and the plurality of pieces of write data that correspond to the burst length and that are serially input via the data I/O pads from the memory controller 100. The I/O circuit 300 may provide, to the I/O data buffer 270, the plurality of pieces of serially input write data that correspond to the burst length.

The I/O circuit 300 may receive the differential clock signal CK_t/CK_c. In addition, the I/O circuit 300 may receive the data mask inversion signal DMI. The data mask inversion signal DMI may include information on whether the data DQs is masked or inverted or may include the first link parity LPRT1 or the second link parity LPRT2.

Figure 4A:
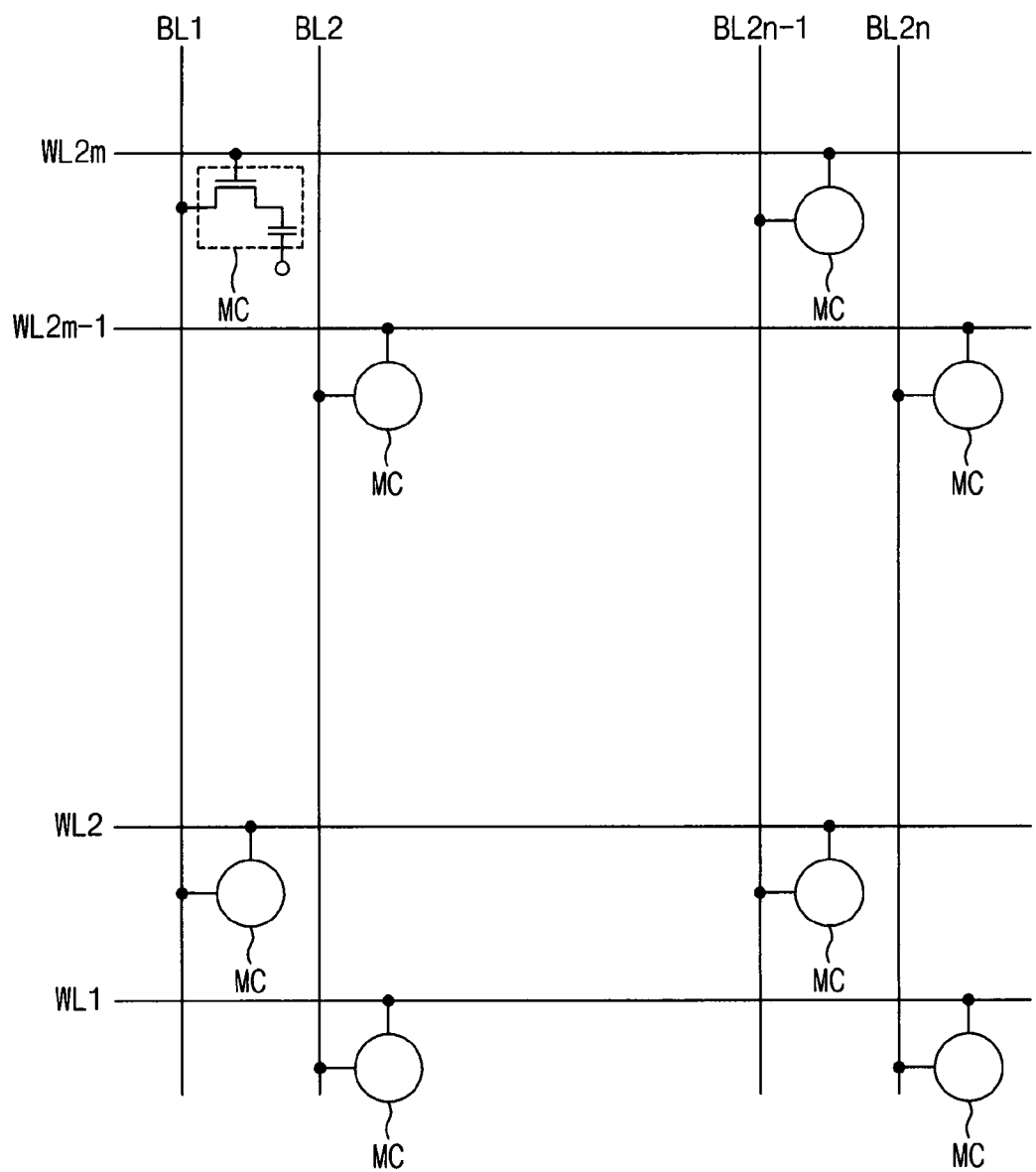
FIG. 4A illustrates an example of the first bank array in the semiconductor memory device of FIG. 3.

FIG. 4A illustrates an example of the first bank array in the semiconductor memory device of FIG. 3.

Referring to FIG. 4A, the first bank array 240A includes a plurality of word-lines WL1~WL2$m$ (m is a natural number greater than one), a plurality of bit-lines BL1~BL2$n$ (n is a natural number greater than one), and a plurality of memory cells MCs disposed near intersections between the word-lines WL1~WL2$m$ and the bit-lines BL1~BL2$n$. In one embodiment, each of the plurality of memory cells MCs may include a dynamic random access memory (DRAM) cell structure. The plurality of word-lines WL1~WL2$m$ to which the plurality of memory cells MCs are connected may be defined as rows of the first bank array 240A and the plurality of bit-lines BL1~BL2$n$ to which the plurality of memory cells MCs are connected may be defined as columns of the first bank array 240A.

In FIG. 4A, m memory cells are coupled to a bit-line BL of the first bank array 240A and n memory cells are coupled to a word-line of the first bank array 240A.

Figure 4B:
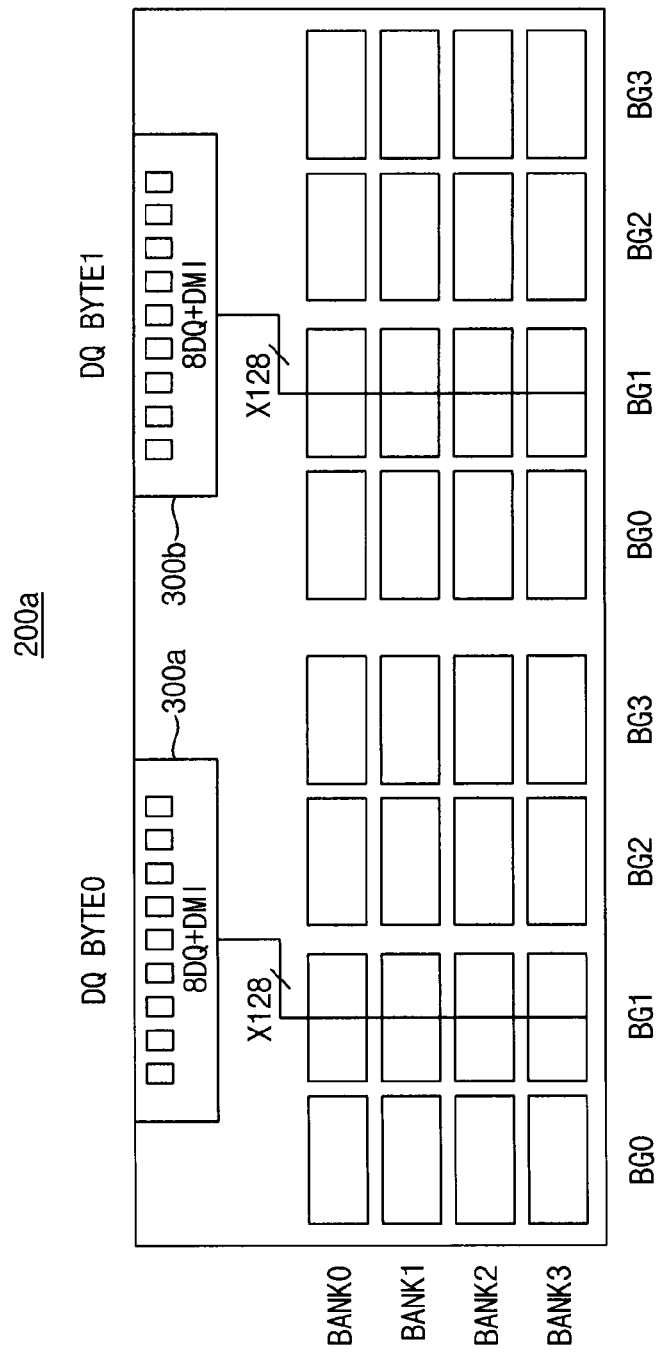
Figure 4C:
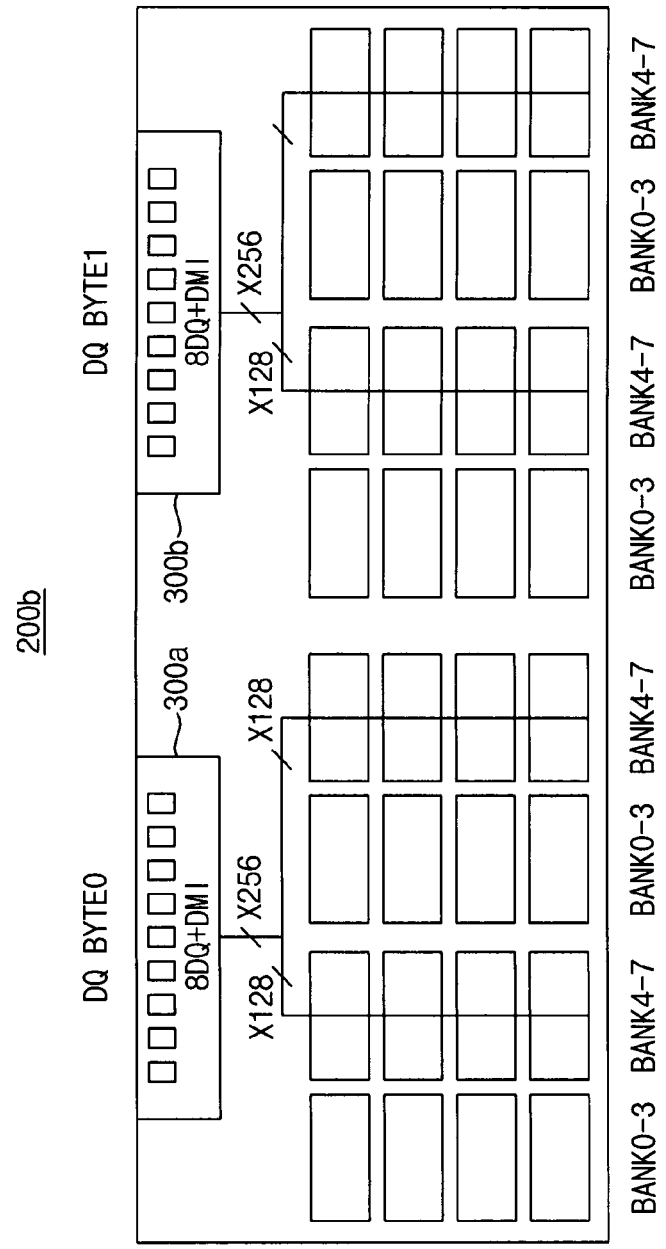

FIG. 4B through 4D illustrate examples of the memory cell array in the semiconductor memory device of FIG. 3 according to exemplary embodiments, respectively.

In FIG. 4B through 4D, sub I/O circuits 300$a$ and 300$b$ are illustrated together with bank arrays.

FIG. 4B illustrates an example that the semiconductor memory device 200 of FIG. 3 operates in four banks/four bank groups mode.

Referring to FIG. 4B, the memory cell array in FIG. 3 includes four bank groups BG0~BG3, and each of the bank groups BG0~BG3 includes four bank arrays BANK0~BANK3. Each of the sub I/O circuits 300$a$ and 300$b$ may be associated with four bank groups BG0~BG3 and may input/output 128-bit data.

FIG. 4C illustrates an example that the semiconductor memory device 200 of FIG. 3 operates in eight banks mode.

Referring to FIG. 4C, the memory cell array in FIG. 3 includes eight bank arrays BANK0~BANK7. Each of the sub I/O circuits 300$a$ and 300$b$ may be associated with eight bank arrays BANK0~BANK7 and may input/output 256-bit data.

FIG. 4D illustrates an example that the semiconductor memory device 200 of FIG. 3 operates in sixteen banks mode.

Referring to FIG. 4D, the memory cell array in FIG. 3 includes sixteen bank arrays BANK0~BANK15. Each of the sub I/O circuits 300a and 300b may be associated with sixteen bank arrays BANK0~BANK15 and may input/output 128-bit data.

Figure 5:
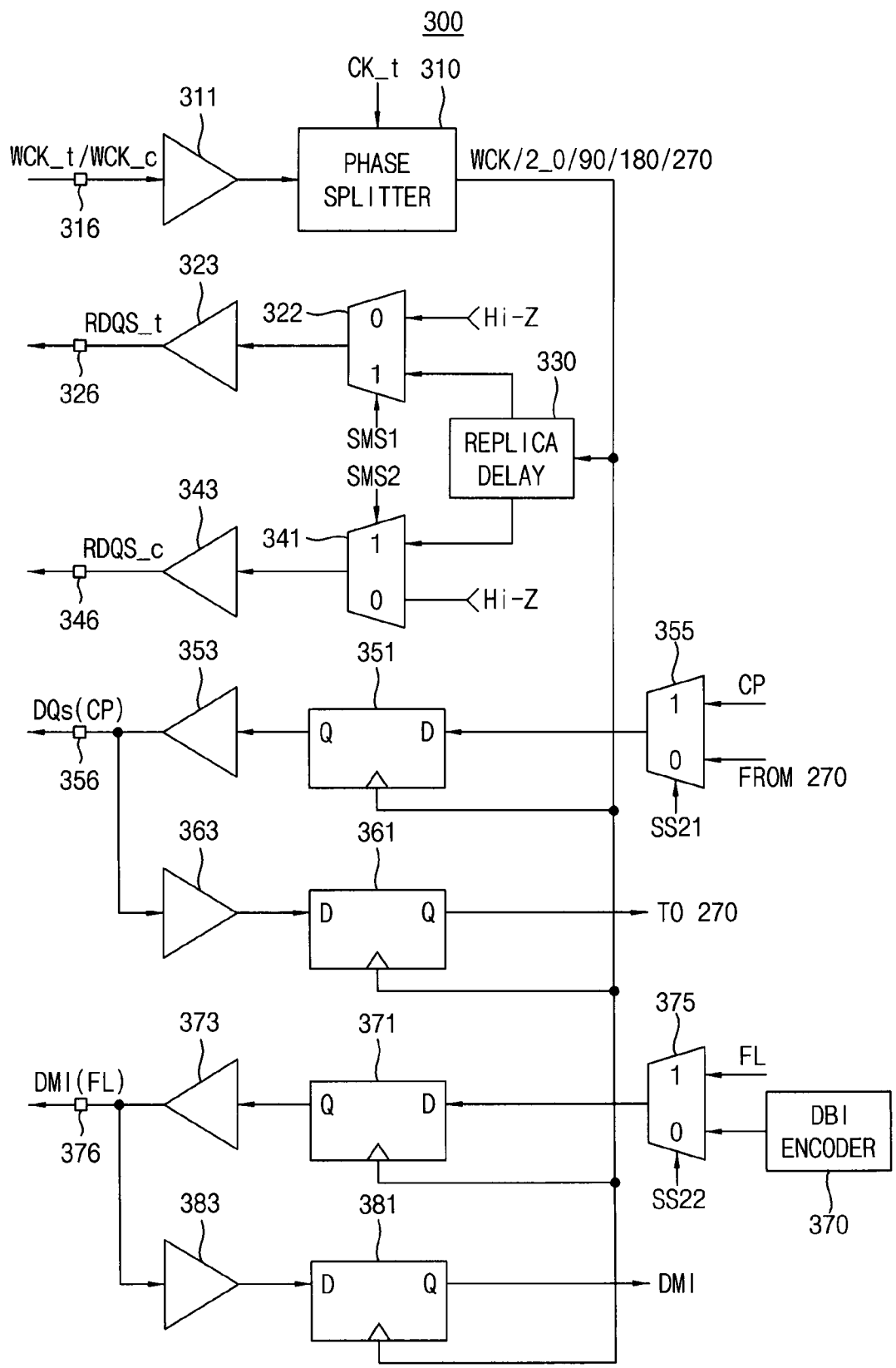
FIG. 5 illustrates an example of the I/O circuit in the semiconductor memory device of FIG. 3 according to exemplary embodiments.

FIG. 5 illustrates an example of the I/O circuit in the semiconductor memory device of FIG. 3 according to exemplary embodiments.

Referring to FIG. 5, the I/O circuit 300 may include a data clock signal receiver 311, a phase splitter 310, a multiplexer 321, a multiplexer 322, a transmitter 323, a replica delay 330, a multiplexer 341, a transmitter 343, a first sampler 351, a data transmitter 353, a second sampler 361, a data receiver 363, a transmitter 373, a third sampler 371, a receiver 383, a fourth sampler 381, a demultiplexer 375 and a DBI encoder 370.

The data clock signal receiver 311 receives the differential data clock signal WCK_t/WCK_c from the memory controller 100 through a pad 316 to provide the differential data clock signal WCK_t/WCK_c to the phase splitter 310.

The phase splitter 310 divides a frequency of the differential data clock signal WCK_t/WCK_c, generates frequency-divided data clock signals WCK/2_0, WCK/2_90, WCK/2_180, and WCK/2_270 and matches a phase of the first frequency-divided data clock signals WCK/_0 to a phase of the main clock signal CK_t. The phase splitter 310 provides the frequency-divided data clock signals WCK/2_0, WCK/2_90, WCK/2_180, and WCK/2_270 to the replica delay 330, the first sampler 351, the second sampler 361, the third sampler 371 and the fourth sampler 381. Each frequency of the frequency-divided data clock signals WCK/2_0, WCK/2_90, WCK/2_180, and WCK/2_270 may be a half of the frequency of the differential data clock signal WCK_t/WCK_c.

The multiplexer 322, in response to a first strobe mode signal SMS1, outputs a high impedance Hi_Z in the access mode and outputs an output of the replica delay 330 as the first strobe signal RDQS_t in a first strobe mode or a second strobe mode.

The multiplexer 341, in response to a second strobe mode signal SMS2, outputs a high impedance Hi_Z in the access mode and outputs an output of the replica delay 330 as the second strobe signal RDQS_c in the first strobe mode or the second strobe mode.

The transmitter 323 may transmit an output of the multiplexer 322 to the memory controller 100 through a pad 326. The transmitter is driven to the high impedance Hi_Z in the access mode, and transmits the first strobe signal RDQS_t to the memory controller 100 in the first strobe mode or the second strobe mode.

The replica delay 330 may adjust phases of two frequency-divided clock signals of the frequency-divided clock signals WCK/2_0, WCK/2_90, WCK/2_180, and WCK/2_270, for example, the first and third frequency-divided clock signals WCK/2_0 and WCK/2_180 which have a phase difference of 180 degrees with respect to each other, may provide one of the first and third frequency-divided clock signals WCK/2_0 and WCK/2_180 to the multiplexer 322 and may provide the other of the first and third frequency-divided clock signals WCK/2_0 and WCK/2_180 to the third multiplexer 341.

The transmitter 343 is driven to the high impedance Hi_Z in the access mode, and transmits the first strobe signal RDQS_t to the memory controller 100 in the first strobe mode or the second strobe mode through a pad 346.

The multiplexer 355 provides the first sampler 351 with one of the data DQs and the calibration pattern CP in response to a selection signal SS21. The first sampler 355 provides the data transmitter 353 with an output of the multiplexer 355 in synchronization with one of the frequency-divided clock signals WCK/2_0, WCK/2_90, WCK/2_180, and WCK/2_270 in the read operation or the read data calibration mode, and the data transmitter 353 transmits the output of the multiplexer 355 to the memory controller 100 through a pad 356.

The data receiver 363 receives data DQs (i.e., write data) from the memory controller 100 and provides the write data DQs to the second sampler 361 through the pad 356 and the data receiver 363, and the second sampler 361 provides the write data DQs to the I/O data buffer 270 in synchronization with one of the frequency-divided clock signals WCK/2_0, WCK/2_90, WCK/2_180, and WCK/2_270, in the write operation.

The multiplexer 375, in response to a selection signal SS22, provides the third sampler 371 with one of flag information FL and an output of the DBI encoder 370. The third sampler 371 provides the transmitter 373 with an output of the multiplexer 375 in synchronization with one of the frequency-divided clock signals WCK/2_0, WCK/2_90, WCK/2_180, and WCK/2_270 in the read operation or the read data calibration mode, and the transmitter 373 transmits the output of the third sampler 371 to the memory controller 100 through a pad 376.

The receiver 383 receives the data mask inversion signal DMI from the memory controller 100 through the pad 376 and provides the data mask inversion signal DMI to the fourth sampler 381, and the fourth sampler 381 provides the data mask inversion signal DMI to the I/O data buffer 270 in synchronization with one of the frequency-divided clock signals WCK/2_0, WCK/2_90, WCK/2_180, and WCK/2_270.

In FIG. 5, the first and second strobe mode signals SMS1 and SMS2 may be included in the strobe mode signal SMS in FIG. 3.

Table 1 below explains assignment of the mode registers included in the mode register set 222 in the semiconductor memory device of FIG. 3.

TABLE 1

| MR# | MA[6:0] | Access | OP[7] | OP[6] | OP[5] | OP[4] | OP[3] | OP[2] | OP[1] | OP[0] |
|---|---|---|---|---|---|---|---|---|---|---|
| 0 | $00_H$ | R | | | | RFU | | | Latency mode | RFU |
| 1 | $01_H$ | W | | | WL | | CK Mode | | RFU | |
| | | | | | WL | | CK Mode | | | |
| | | | | | WL | | CK Mode | | | |
| 2 | $02_H$ | W | | | nWR | | | | RL and nRBTP | |
| | | | | | nWR | | | | RL and nRBTP | |
| | | | | | nWR | | | | RL and nRBTP | |

TABLE 1-continued

| MR# | MA[6:0] | Access | OP[7] | OP[6] | OP[5] | OP[4] | OP[3] | OP[2] | OP[1] | OP[0] |
|---|---|---|---|---|---|---|---|---|---|---|
| 3 | $03_H$ | W | DBI-WR | DBI-RD | WLS | | BK/BG ORG | | | PDDS |
| | | | DBI-WR | DBI-RD | WLS | | BK/BG ORG | | | PDDS |
| | | | DBI-WR | DBI-RD | WLS | | BK/BG ORG | | | PDDS |
| 4 | $04_H$ | R | TUF | ZQ Master | ZQUF | | | Refresh Rate | | |
| 5 | $05_H$ | R | | | | LPDDR5 Manufacturer ID | | | | |
| 6 | $06_H$ | R | | | | Revision ID_1 | | | | |
| 7 | $07_H$ | R | | | | Revision ID_2 | | | | |
| 8 | $08_H$ | R | | IO Width | | | Density | | | Type |
| 9 | $09_H$ | W | | | | Vendor Specific Test Register | | | | |
| 10 | $0A_H$ | W | RDQS PST | | RDQS PRE | | WCK PST | | RFU | RPST Mode |
| | | | RDQS PST | | RDQS PRE | | WCK PST | | | RPST Mode |
| | | | RDQS PST | | RDQS PRE | | WCK PST | | | RPST Mode |
| 11 | $0B_H$ | W | RFU | | CA ODT | | NT-ODT EN | | DQ ODT | |
| | | | RFU | | CA ODT | | NT-ODT EN | | DQ ODT | |
| | | | RFU | | CA ODT | | NT-ODT EN | | DQ ODT | |
| 12 | $0C_H$ | R/W | VBS | | | $V_{REF}(CA)$ | | | | |
| | | | | | | $V_{REF}(CA)$ | | | | |
| | | | | | | $V_{REF}(CA)$ | | | | |
| 13 | $0D_H$ | W | Dual VDD2 | CBT Mode | DMD | RFU | VRO | Thermal Offset | 13 | $0D_H$ |
| 14 | $0E_H$ | R/W | VLDC | | | $V_{REF}(DQ[7:0])$ | | | | |
| | | | | | | $V_{REF}(DQ[7:0])$ | | | | |
| | | | | | | $V_{REF}(DQ[7:0])$ | | | | |
| 15 | $0F_H$ | R/W | RFU | | | $V_{REF}(DQ[15:8])$ | | | | |
| | | | | | | $V_{REF}(DQ[15:8])$ | | | | |
| | | | | | | $V_{REF}(DQ[15:8])$ | | | | |
| 16 | $10_H$ | R/W | CBT-PH | VRGC | | CBT | | FSP-OP | | FSP-WR |
| 17 | $11_H$ | W | x8ODTD Upper | x8ODTD Lower | ODTD-CA | RFU | ODTD-CK | | SOC ODT | |
| | | | | | ODTD-CA | | ODTD-CK | | SOC ODT | |
| | | | | | ODTD-CA | | ODTD-CK | | SOC ODT | |
| 18 | $12_H$ | W | CKR | WCK2CK | WCKSYNC | WCK ON | RFU | | WCK Termination | |
| | | | CKR | | WCKSYNC | WCK ON | | | WCK Termination | |
| | | | CKR | Leveling | WCKSYNC | WCK ON | | | WCK Termination | |
| 19 | $13_H$ | W | | | RFU | | DVFSQ | | DVFSC | |
| | | | | | | | DVFSQ | | DVFSC | |
| | | | | | | | DVFSQ | | DVFSC | |
| 20 | $14_H$ | W | RDC DQ Mode | RDC DMI Mode | RFU | | WCK Mode | | RDQS | |
| | | | | | | | WCK Mode | | RDQS | |
| | | | | | | | WCK Mode | | RDQS | |
| 21 | $15_H$ | R/W | RFU | WXFE | RDCFE | WDCFE | RFU | WXFS | RDCFS | WDCFS |
| 22 | $16_H$ | W | | RECC | | WECC | | | RFU | |
| 23 | $17_H$ | W | | | | PASR Segment Mask | | | | |
| 24 | $18_H$ | N/A | | | | RFU | | | | |
| 25 | $19_H$ | W | RFU | PACR | CA BUS TERM | CK BUS TERM | RFU | RFU | RFU | RFU |
| 26 | $1A_H$ | N/A | | | | RFU | | | | |
| 27 | $1B_H$ | TBD | | | | RFU | | | | |
| 28 | $1C_H$ | W | | RFU | ZQ Mode | RFU | | ZQ Interval | ZQ Stop | ZQ Reset |
| 29 | $1D_H$ | W | | | | RFU | | | | |
| 30 | $1E_H$ | W | | DCA for Upper Byte | | | | DCA for Lower Byte | | |
| | | | | DCA for Upper Byte | | | | DCA for Lower Byte | | |
| | | | | DCA for Upper Byte | | | | DCA for Lower Byte | | |
| 31 | $1F_H$ | W | | | Lower-Byte Invert Register for DQ Calibration | | | | | |
| 32 | $20_H$ | W | | | Upper-Byte Invert Register for DQ Calibration | | | | | |
| 33 | $21_H$ | W | | | DQ Calibration Pattern "A" | | | | | |
| 34 | $22_H$ | W | | | DQ Calibration Pattern "B" | | | | | |
| 35 | $23_H$ | R | | | WCK2DQI Oscillator Count - LSB | | | | | |
| 36 | $24_H$ | R | | | WCK2DQI Oscillator Count - MSB | | | | | |
| 37 | $25_H$ | W | | | WCK2DQI interval timer run time setting | | | | | |
| 38 | $26_H$ | R | | | WCK2DQO Oscillator Count - LSB | | | | | |

TABLE 1-continued

| MR# | MA[6:0] | Access | OP[7] | OP[6] | OP[5] | OP[4] | OP[3] | OP[2] | OP[1] | OP[0] |
|---|---|---|---|---|---|---|---|---|---|---|
| 39 | $27_H$ | R | | | | WCK2DQO Oscillator Count - MSB | | | | |
| 40 | $28_H$ | W | | | | WCK2DQO interval timer run time setting | | | | |
| 41 | $29_H$ | R/W | | NT DQ ODT NT DQ ODT NT DQ ODT | | | PPRE | | | PPR Resource |
| 42 | $2A_H$ | W | | RFU | | | PPR Key Protection | | | RFU |
| 43 | $2B_H$ | N/A | | | | RFU (reserved for TEST) | | | | |
| 44 | $2C_H$ | N/A | | | | RFU (reserved for TEST) | | | | |
| 45: 63 | $2D_H$ _$3F_H$ | N/A | | | | DNU (Do not Use) | | | | |

Note:
1. RFU bits shall be set to '0' during writes.
2. RFU bits shall be read as '0' during reads.
3. All mode registers that are specified as RFU or write-only shall return undefined data when read.
4. All mode registers that are specified as RFU should not be written.
5. Writes to read-only registers shall have no impact on the functionality of the device.

Referring to table 1, the mode register set 222 may include first through sixty-fourth mode registers MR0~MR63.

Table 2 below explains the twenty-first mode register in Table 1.

As is noted from Table 2, operands OP0~OP7 of the twenty-first mode register MR20 may designate the strobe mode and the read data calibration RDC DQ mode in the read operation.

| MR20 Register Information (MA[6:0] = $14_H$) | | | | | | | |
|---|---|---|---|---|---|---|---|
| OP[7] | OP[6] | OP[5] | OP[4] | OP[3] | OP[2] | OP[1] | OP[0] |
| RDC DQ Mode | RDC DMI Mode | RFU | | WCK Mode | | RDQS | |

| Function | Register Type | Operand | Data | Notes |
|---|---|---|---|---|
| RDQS (Read DQS) | Write-Only | OP[1:0] | $00_B$: RDQS-t and RDQS-c disabled<br>$01_B$: RDQS-t enabled and RDQS-c disabled (default)<br>$10_B$: RDQS-t and RDQS-c enabled<br>$11_B$: RDQS-t disabled and RDQS-c enabled | 1, 2, 3, 6, 7, 9 |
| WCK Mode | | OP[3:2] | $00_B$: differential (default)<br>$01_B$: single-ended WCK-t<br>$10_B$: single-ended WCK-c<br>$11_B$: reserved | 1, 2, 3, 4, 5, 8 |
| RDC DMI Mode (Read DQ Calibration DMI Mode) | | OP[6] | In Read DQ Calibration, DMI output pattern is controlled as:<br>$0_B$: DMI pattern will be decided by MR33/34. (default)<br>$1_B$: DMI pattern will be low-fixed. | |
| RDC DMI Mode (Read DQ Calibration DMI Mode) | | OP[6] | In Read DQ Calibration, DQ output pattern is controlled by MR31/32(per-bit control), where, MR31/32 function is defined as:<br>$0_B$: MR31/32 decides whether "invert" or not. (default)<br>$1_B$: MR31/32 decides whether "low-fix" or not. | |

Note:
1. There are three physical registers assigned to each bit of this MR parameter, designated set point 0, set point 1 and set point 2. Only the registers for the set point determined by the state of the FSP-WR bit (MR16 OP[1:0]) will be written to with an MRW command to this MR address.
2. There are three physical registers assigned to each bit of this MR parameter, designated set point 0, set point 1 and set point 2. The device will operate only according to the values stored in the registers for the active set point, i.e., the set point determined by the state of the FSP-OP bit (MR16 OP[3:2]). The values in the registers for the inactive set point will be ignored by the device, and may be changed without affecting device operation.
3. WCK clocking generates RDQS_t and RDQS_c.
4. When MR20 OP[3:2] = $01_B$, WCK_t is used as WCK timing, and DRAM should ignore WCK_c.
5. When MR20 OP[3:2] = $10_B$, WCK_c is used as WCK timing, and DRAM should ignore WCK_t.
6. When MR20 OP[1:0] = $01_B$, RDQS_t is used as RDQS timing, and RDQS_c should be Hi-Z state.
7. When MR20 OP[1:0] = $11_B$, RDQS_c is used as RDQS timing, and RDQS_t should be Hi-Z state.
8. When MR20 OP[3:2] = $01_B$, WCK_t polarity is the same as WCK_t in MR20 OP[3:2] = $00_B$, and when MR20 OP[3:2] = $10_B$, WCK_c polarity is the same as WCK_c in MR20 OP[3:2] = $10_B$.
9. When MR20 OP[1:0] = $01_B$, RDQS_t polarity is the same as RDQS_t in MR20 OP[1:0] = $10_B$, and when MR20 OP[1:0] = $11_B$, RDQS_c polarity is the same as RDQS_c in MR20 OP[1:0] = $10_B$.

Tables 3 through 6 below explain the thirty-second mode register through thirty-fifth mode register in Table 2, respectively.

TABLE 3

MR31 Register information (MA[6:0] = 1FH)

| OP[7] | OP[6] | OP[5] | OP[4] | OP[3] | OP[2] | OP[1] | OP[0] |
|-------|-------|-------|-------|-------|-------|-------|-------|
| Lower-Byte Invert Register for DQ Calibration | | | | | | | |

| Function | Register Type | Operand | Data | Notes |
|----------|---------------|---------|------|-------|
| Lower-Byte Invert for DQ Calibration | Write-Only | OP[7:0] | The following values may be written for any operand OP[7:0], and will be applied to the corresponding DQ locations DQ[7:0] within a byte lane:<br>$0_B$: Do not invert<br>$1_B$: Invert the DQ Calibration patterns in MR33 and MR34<br>Default value for OP[7:0] = $55_H$ | 1, 2, 3, 4 |

Note:
1. This register will invert the DQ Calibration pattern found in MR33 and MR34 for any single DQ, or any combination of DQ's. Example: If MR31 OP[7:0] = 00010101B, then the DQ Calibration patterns transmitted on DQ[7, 6, 5, 3, 1] will not be inverted, but the DQ Calibration patterns transmitted on DQ[4, 2, 0] will be inverted.
2. DMI[0] is not inverted, and always transmits the "true" data contained in MR33/MR34.
3. No Data Bus Inversion (DBI) function is enacted during DQ Read Calibration, even if DBI is enabled in MR3-OP[6:5].
4. In case of byte mode, MR31 is valid only for lower byte selected device.

TABLE 4

MR32 Register information (MA[6:0] = $20_H$)

| OP[7] | OP[6] | OP[5] | OP[4] | OP[3] | OP[2] | OP[1] | OP[0] |
|-------|-------|-------|-------|-------|-------|-------|-------|
| Upper-Byte Invert Register for DQ Calibration | | | | | | | |

| Function | Register Type | Operand | Data | Notes |
|----------|---------------|---------|------|-------|
| Upper-Byte Invert for DQ Calibration | Write-Only | OP[7:0] | The following values may be written for any operand OP[7:0], and will be applied to the corresponding DQ locations DQ[15:8] within a byte lane:<br>$0_B$: Do not invert<br>$1_B$: Invert the DQ Calibration patterns in MR33 and MR34 Default value for OP[7:0] = $55_H$ | 1, 2, 3, 4 |

Note:
1. This register will invert the DQ Calibration pattern found in MR33 and MR34 for any single DQ, or any combination of DQ's. Example: If MR32 OP[7:0] = 00010101B, then the DQ Calibration patterns transmitted on DQ[15, 14, 12, 11, 9] will not be inverted, but the DQ Calibration patterns transmitted on DQ[12, 10, 8] will be inverted.
2. DMI[1] is not inverted, and always transmits the "true" data contained in MR33/MR34.
3. No Data Bus Inversion (DBI) function is enacted during DQ Read Calibration, even if DBI is enabled in MR3-OP[6:5].
4. In case of byte mode, MR32 is valid only for lower byte selected device.

TABLE 5

MR33 Register information (MA[6:0] = $21_H$)

| OP[7] | OP[6] | OP[5] | OP[4] | OP[3] | OP[2] | OP[1] | OP[0] |
|-------|-------|-------|-------|-------|-------|-------|-------|
| DQ Calibration Pattern "A" | | | | | | | |

| Function | Register Type | Operand | Data | Notes |
|----------|---------------|---------|------|-------|
| Return DQ Calibration Pattern MR33 + MR34 | Write-Only | OP[7:0] | $X_B$: DQ Calibration pattern A "$5A_H$" (default) | 1, 2, 3, 4 |

TABLE 5-continued

MR33 Register information (MA[6:0] = 21$_H$)

Note:
1. Read DQ Calibration command (RDC) causes the device to return the DQ Calibration Pattern contained in this register followed by the contents of MR34. The pattern contained in MR33 is transmitted on DQ[15:0] and DMI[1:0] when DQ Read Calibration is initiated via an RDC. The pattern is transmitted serially on each data lane, is organized as "big endian" such that the low-order bit in a byte is transmitted first. If the data pattern in MR33 is 27$_H$, then the first bit transmitted with be a '1', followed by '1', '1', '0', '0', '1', '0', and '0'. The bit stream will be 11100100$_B$. A default pattern "5A$_H$" is loaded at power-up or RESET, or the pattern may be overwritten with an MRW to this register. The contents of MR31 and MR32 will invert the data pattern for a given DQ. (See MR31 for more information.)
2. MR31 and MR32 may be used to invert the MR33/MR34 data patterns on the DQ pins. See MR31 and MR32 for more information. Data is never inverted on the DMI[1:0] pins.
3. The data pattern is not transmitted on the DMI[1:0] pins if DBI-RD is disabled via MR3-OP[6:5].
4. No Data Bus Inversion (DBI) function is enacted during DQ Read Calibration, even if DBI is enabled in MR3-OP[6:5].

TABLE 6

MR34 Register information (MA[6:0] = 22$_H$)

| OP[7] | OP[6] | OP[5] | OP[4] | OP[3] | OP[2] | OP[1] | OP[0] |
|---|---|---|---|---|---|---|---|
| DQ Calibration Pattern "B" | | | | | | | |
| Function | Register Type | Operand | Data | | | | Notes |
| Return DQ Calibration Pattern MR33 + MR34 | Write-Only | OP[7:0] | X$_B$: DQ Calibration pattern B "3C$_H$" (default) | | | | 1, 2, 3, 4 |

Note:
1. Read DQ Calibration command (RDC) causes the device to return the DQ Calibration Pattern contained in MR33 and followed by the contents of this register. The pattern contained in MR34 is concatenated to the end of MR33 and transmitted on DQ[15:0] and DMI[1:0] when DQ Read Calibration is initiated via a DRC. The pattern is transmitted serially on each data lane, organized "big endian" such that the low-order bit in a byte is transmitted first. If the data pattern in MR33 is 27$_H$, then the first bit transmitted with be a '1', followed by '1', '1', '0', '0', '1', '0', and '0'. The bit stream will be 111100100$_B$. A default pattern "3C$_H$" is loaded at power-up or RESET, or the pattern may be overwritten with an MRW to this register. See MR33 for more information.
2. MR31 and MR32 may be used to invert the MR33/MR34 data patterns on the DQ pins. See MR31 and MR32 for more information. Data is never inverted on the DMI[1:0] pins..
3. The data pattern is not transmitted on the DMI[1:0] pins if DBI-RD is disabled via MR3-OP[6:5].
4. No Data Bus Inversion (DBI) function is enacted during DQ Read Calibration, even if DBI is enabled in MR3-OP[6].

In example embodiments, the differential strobe signal RDQS_t/RDQS_c may be transmitted through a first pad (e.g., pad 326) and a second pad (e.g., pad 346) among the plurality of pads of the semiconductor memory device 200 which are dedicated to different signals. For example, in the access mode, the pad 326 may be dedicated to a first function signal different from the strobe signal RDQS_t and the pad 346 may be dedicated to a second function signal different from the strobe signal RDQS_c.

Figure 6A:
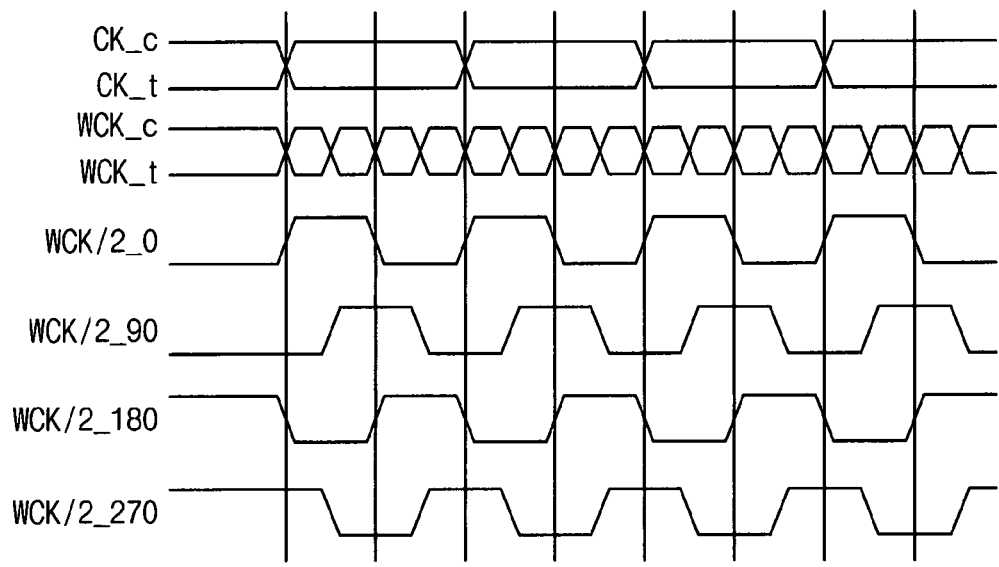
FIG. 6A illustrates that the first frequency-divided data clock signal is automatically synchronized with the main clock signal in the I/O circuit of FIG. 5.
Figure 6B:
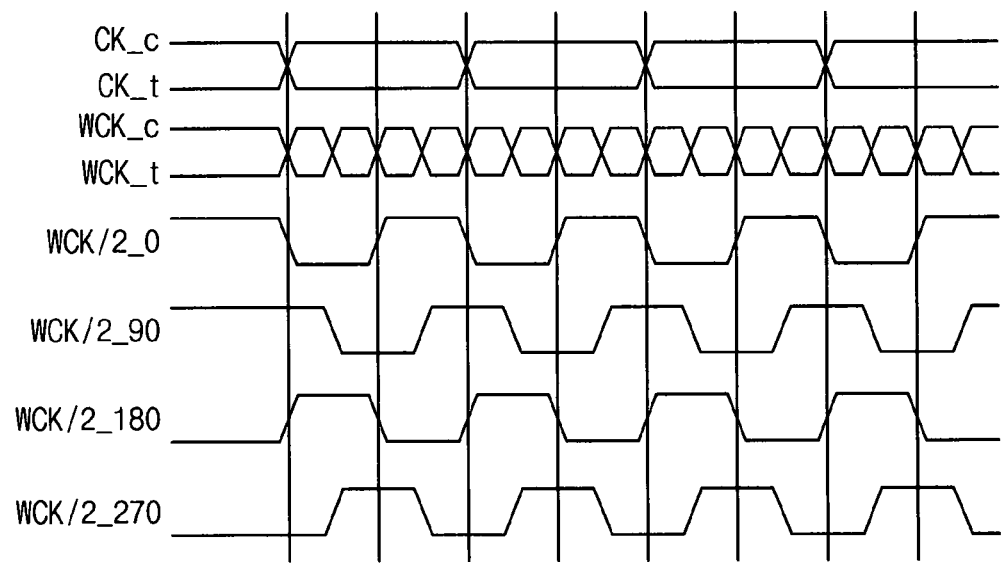
FIG. 6B illustrates that the first frequency-divided data clock signal is not synchronized with the main clock signal in the I/O circuit of FIG. 5.

FIG. 6A illustrates that the first frequency-divided data clock signal WCK/2_0 is automatically synchronized with the main clock signal CK_t in the I/O circuit of FIG. 5, and FIG. 6B illustrates that the first frequency-divided data clock signal WCK/2_0 is not synchronized with the main clock signal CK_t in the I/O circuit of FIG. 5.

Referring to FIG. 6A, it is noted that the phase splitter 310 synchronizes the first frequency-divided data clock signal WCK/2_0 with the main clock signal CK_t.

The semiconductor memory device 200 may perform a synchronization operation to synchronize the first frequency-divided data clock signal WCK/2_0 with the main clock signal CK_t before performing the write operation or the read operation.

Referring to FIG. 6B, it is noted that the first frequency-divided data clock signal WCK/2_0 is misaligned with the main clock signal CK_t.

Figure 7:
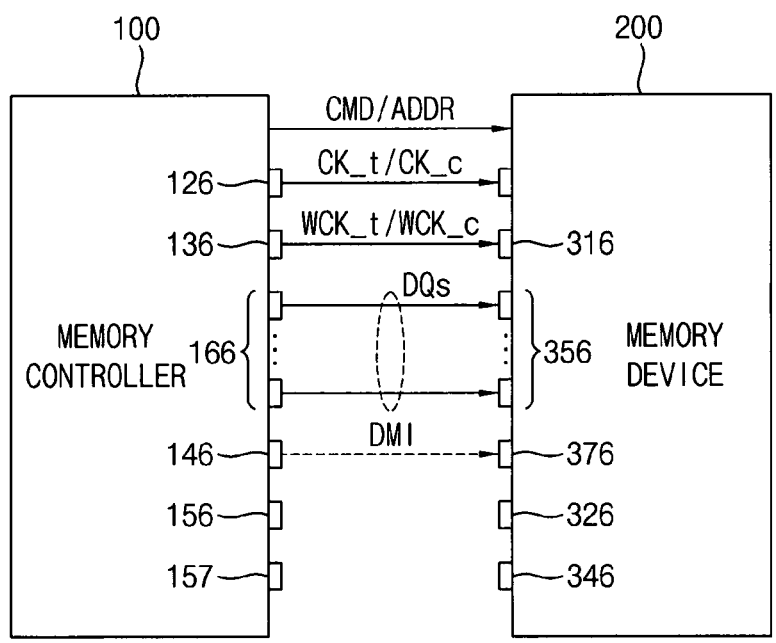
FIG. 7 illustrates an interface of the memory system of FIG. 1 in the write operation and FIG. 8 illustrates operation of the semiconductor memory device of FIG. 3 in the write operation.
Figure 8:
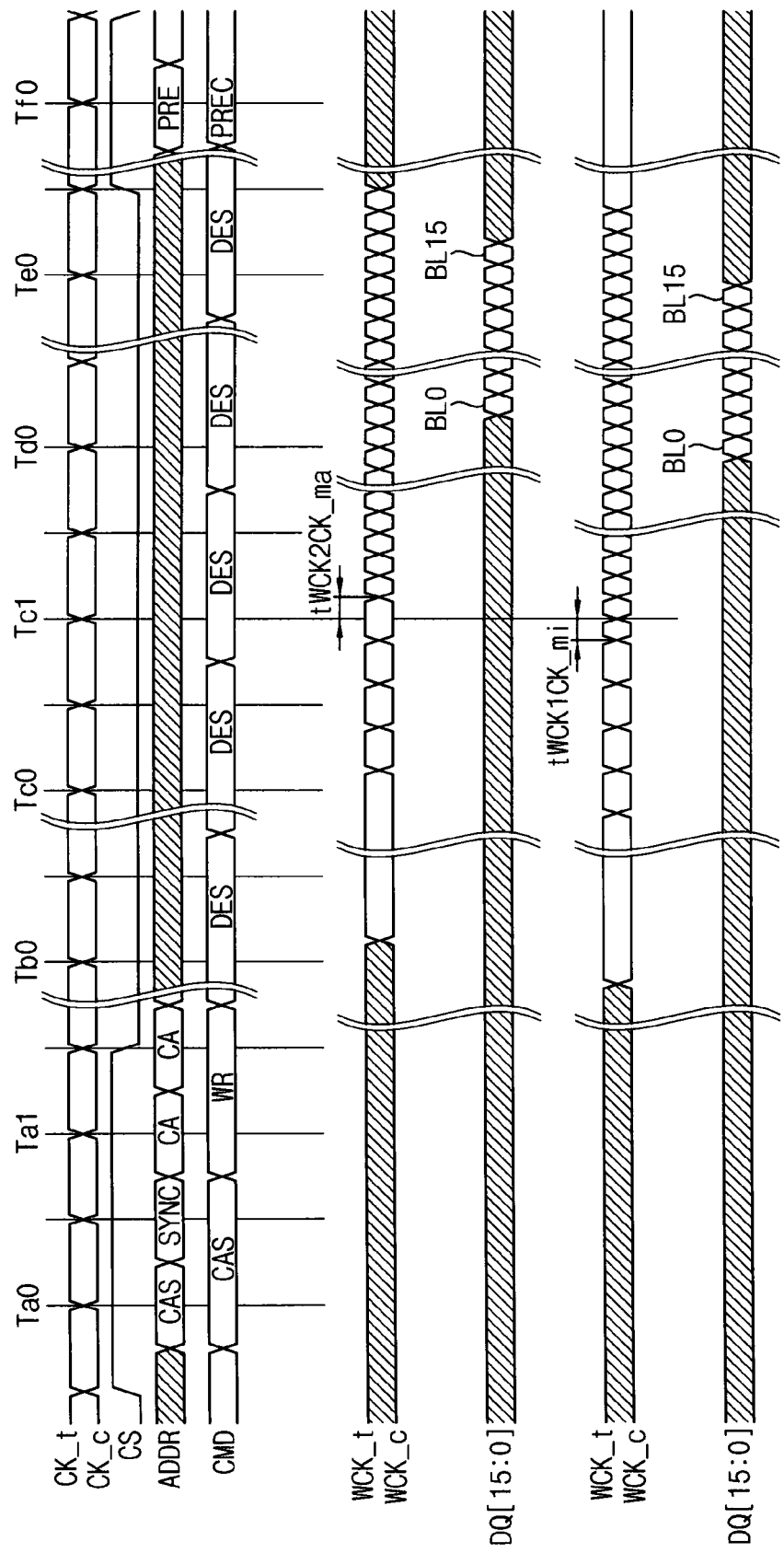

FIG. 7 illustrates an interface of the memory system of FIG. 1 in the write operation and FIG. 8 illustrates operation of the semiconductor memory device of FIG. 3 in the write operation.

Referring to FIGS. 1, 3, 7 and 8, rising edges of the main clock signal CK_t are generated at each of time points Ta0~Tf0, the semiconductor memory device 200 performs the synchronization operation SYNC between the time points Ta0 and Ta1, and the semiconductor memory device 200 receives the write command WR at the time point Ta1. When a phase offset between the data clock signal WCK_t and the main clock signal CK_t has a maximum value tWCK2CK_ma, the data DQ is received by the I/O circuit 300 according to burst lengths BL0~BL15 after the time point Td0 while the data clock signal WCK_t is synchronized with the main clock signal CK_t. When a phase offset between the data clock signal WCK_t and the main clock signal CK_t has a minimum value tWCK2CK_mi, the data DQ is received by the I/O circuit 300 according to burst lengths BL0~BL15 before the time point Td0 while the data clock signal WCK_t is synchronized with the main clock signal CK_t.

In this case, the data mask inversion signal DMI indicating whether the data is masked or inverted is transmitted to the semiconductor memory device 200 from the memory controller 100 through the pads 146 and 376.

Figure 9:
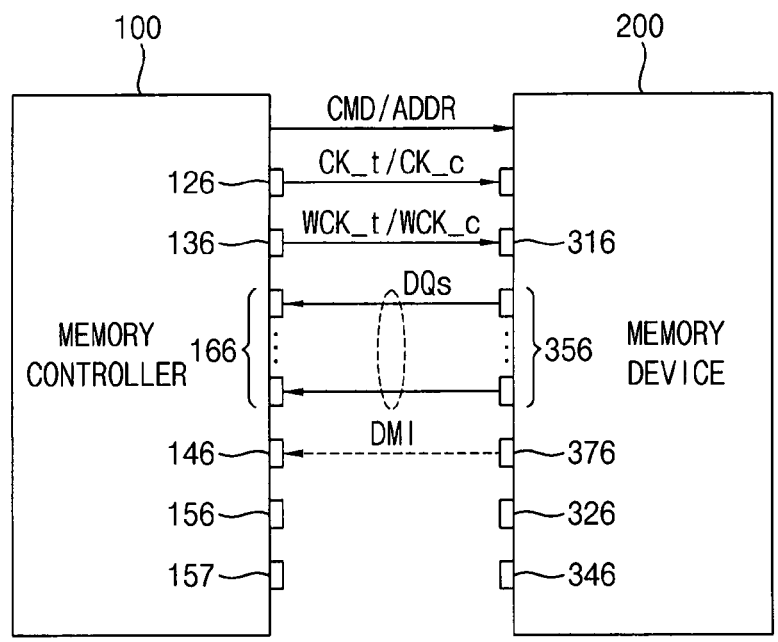
FIG. 9 illustrates an interface of the memory system of FIG. 1 in the read operation and FIG. 10 illustrates operation of the semiconductor memory device of FIG. 3 in the read operation.
Figure 10:
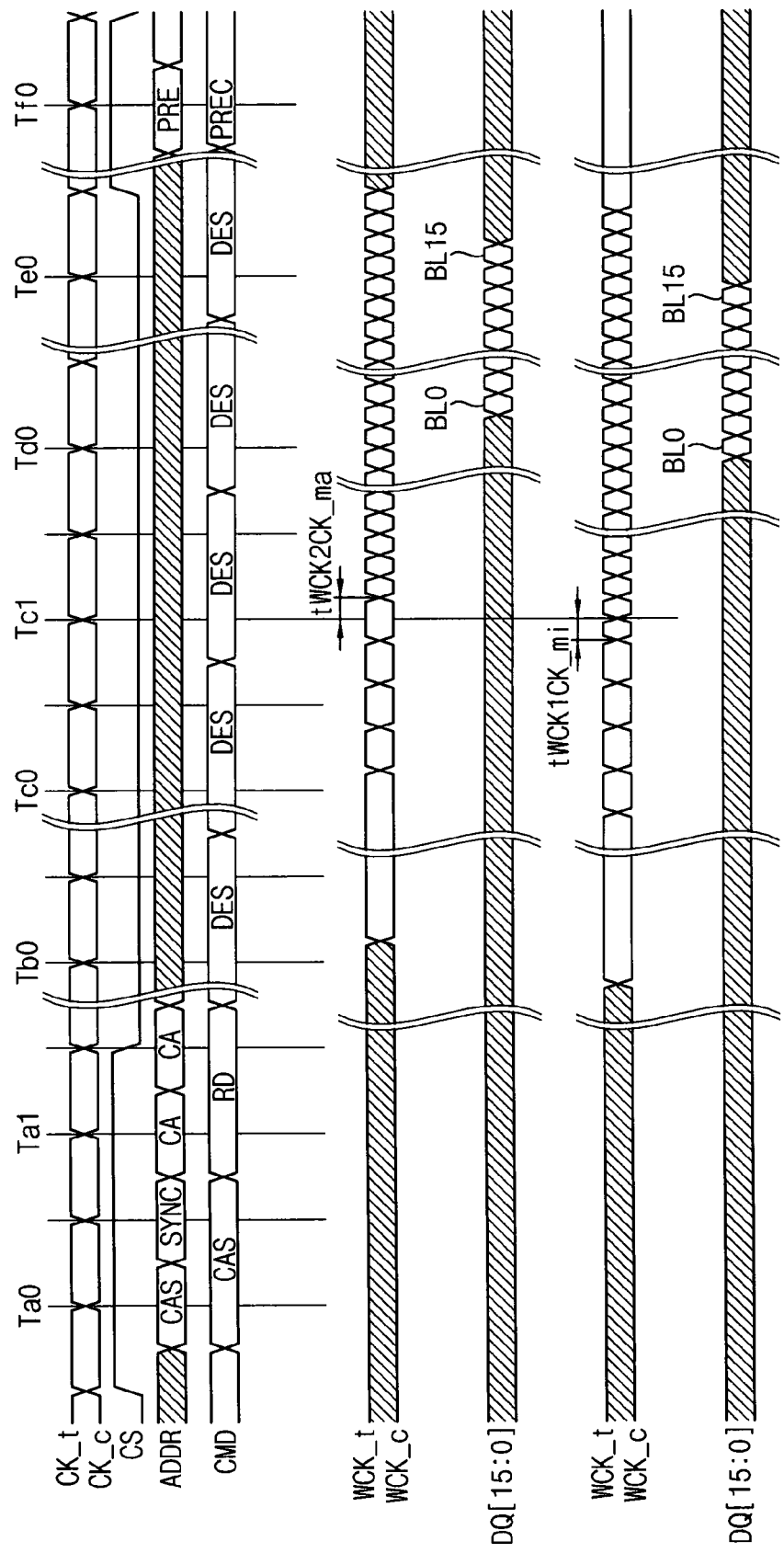

FIG. 9 illustrates an interface of the memory system of FIG. 1 in the read operation and FIG. 10 illustrates operation of the semiconductor memory device of FIG. 3 in the read operation.

Referring to FIGS. 1, 3, 9 and 10, rising edges of the main clock signal CK_t are generated at each of time points Ta0~Tf0, the semiconductor memory device 200 performs the synchronization operation SYNC between the time points Ta0 and Ta1, and the semiconductor memory device 200 receives the read command RD at the time point Ta1. When a phase offset between the data clock signal WCK_t and the main clock signal CK_t has a maximum value tWCK2CK_ma, the data DQ is transmitted to the memory controller 100 according to burst lengths BL0~BL15 after the time point Td0 while the data clock signal WCK_t is synchronized with the main clock signal CK_t. When a phase offset between the data clock signal WCK_t and the main clock signal CK_t has a minimum value tWCK2CK_mi, the data DQ is transmitted to the memory controller 100 according to burst lengths BL0~BL15 around the time point Td0 while the data clock signal WCK_t is synchronized with the main clock signal CK_t.

In this case, the data mask inversion signal DMI may be transmitted to the memory controller 100 from the semiconductor memory device 200 through the pads 376 and 146.

Figure 11:
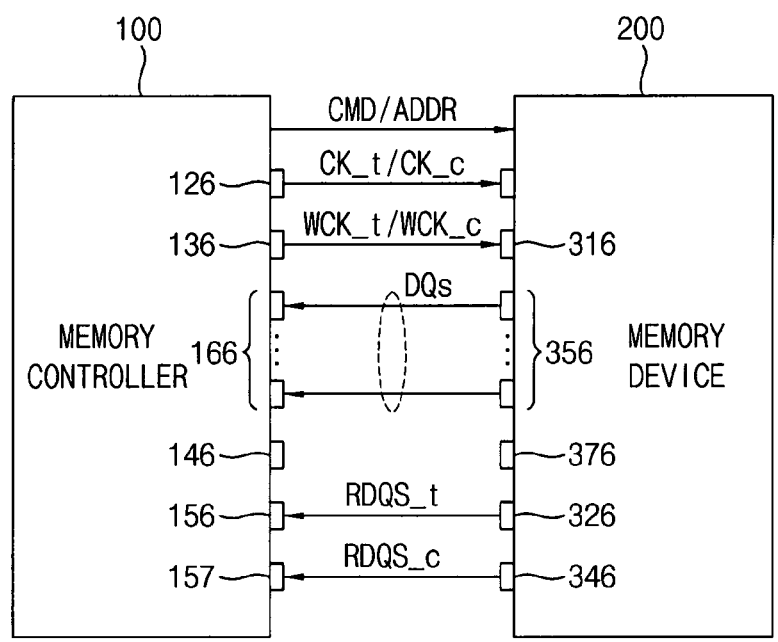
FIG. 11 illustrates an interface of the memory system of FIG. 1 in the second strobe mode and FIG. 12 illustrates operation of the semiconductor memory device of FIG. 3 in the second strobe mode.
Figure 12:
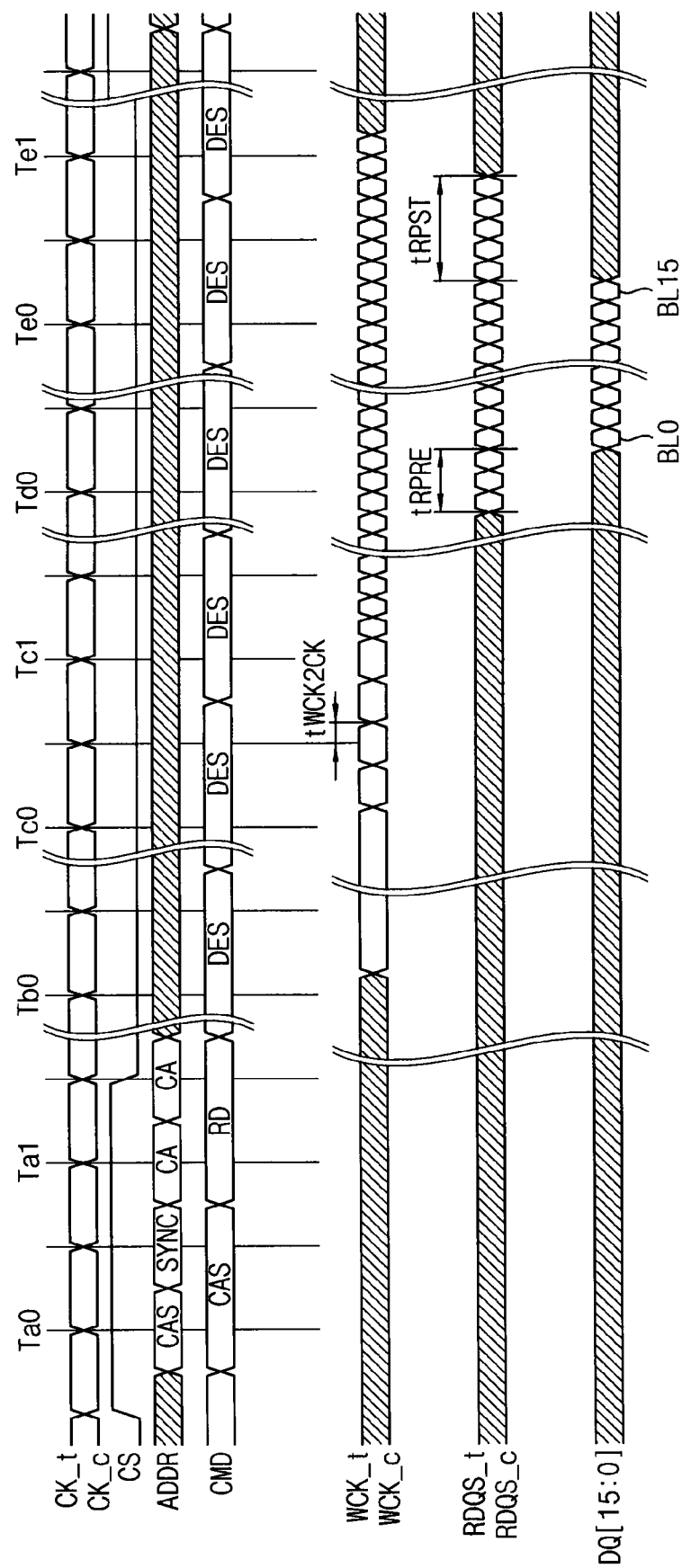

FIG. 11 illustrates an interface of the memory system of FIG. 1 in the second strobe mode and FIG. 12 illustrates operation of the semiconductor memory device of FIG. 3 in the second strobe mode.

Referring to FIGS. 1, 3, 11 and 12, rising edges of the main clock signal CK_t are generated at each of time points Ta0~Te1, the semiconductor memory device 200 performs the synchronization operation SYNC between the time points Ta0 and Ta1, and the semiconductor memory device 200 receives the read command RD at the time point Ta1. When a phase offset between the data clock signal WCK_t and the main clock signal CK_t has a value of tWCK2CK, the differential strobe signal RDQS_t/RDQS_c is transmitted to the memory controller 100 through the pads 326 and 346 before the time point Td0, and the data DQ is transmitted to the memory controller 100 according to burst lengths BL0~BL15 after a pre-amble tRPRE elapses from the time point when the differential strobe signal RDQS_t/RDQS_c is transmitted. The transmission of the differential strobe signal RDQS_t/RDQS_c is completed after a post-amble tRPST elapses from the last burst length BL15. In this case, a frequency of the differential strobe signal RDQS_t/RDQS_c is substantially the same as a frequency of the data DQs.

Figure 13:
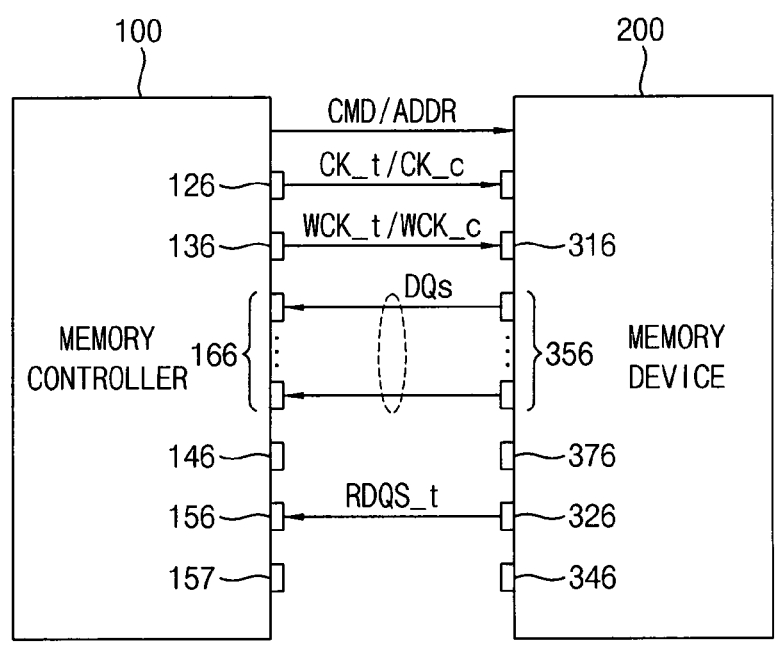
FIG. 13 illustrates an interface of the memory system of FIG. 1 in the first strobe mode and FIG. 14 illustrates operation of the semiconductor memory device of FIG. 3 in the first strobe mode.
Figure 14:
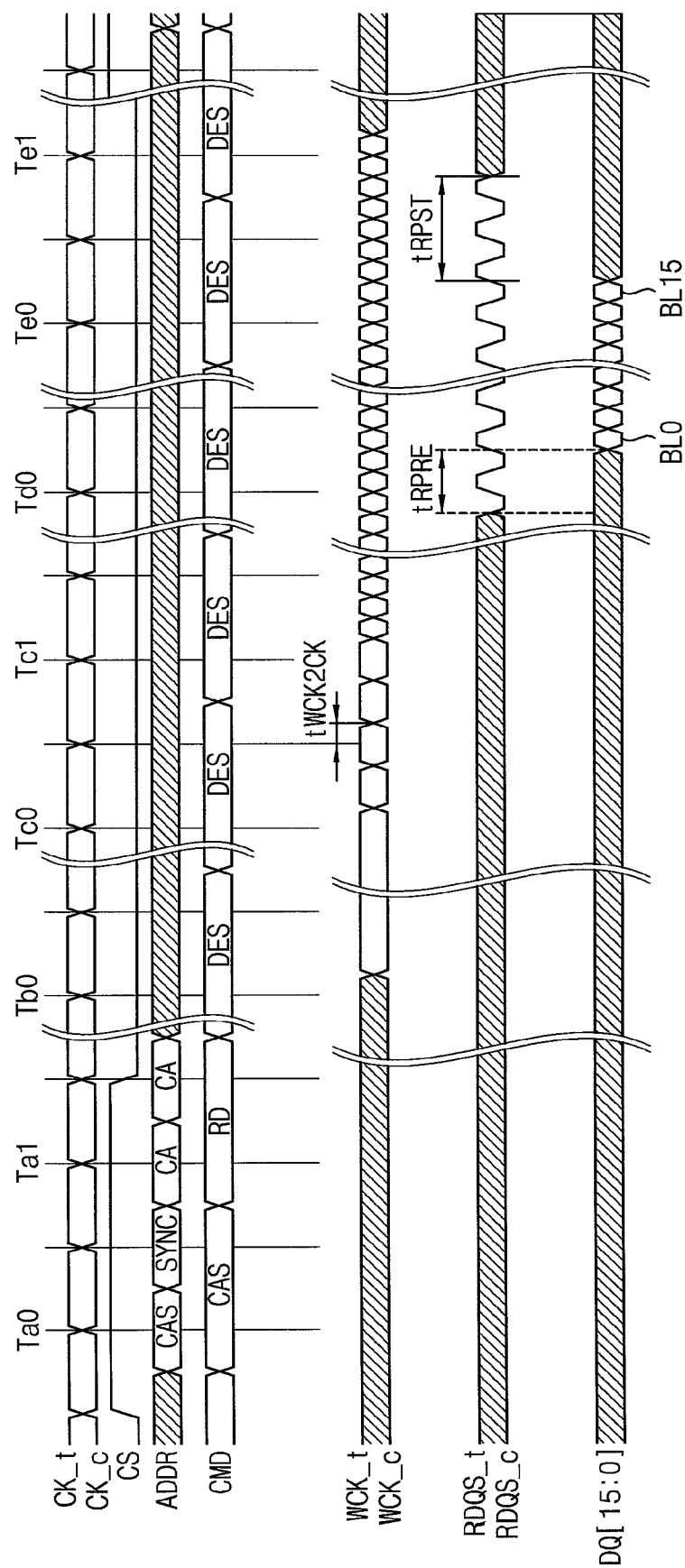

FIG. 13 illustrates an interface of the memory system of FIG. 1 in the first strobe mode and FIG. 14 illustrates operation of the semiconductor memory device of FIG. 3 in the first strobe mode.

Referring to FIGS. 1, 3, 13 and 14, rising edges of the main clock signal CK_t are generated at each of time points Ta0~Te1, the semiconductor memory device 200 performs the synchronization operation SYNC between the time points Ta0 and Ta1, and the semiconductor memory device 200 receives the read command RD at the time point Ta1. When a phase offset between the data clock signal WCK_t and the main clock signal CK_t has a value of tWCK2CK, the first strobe signal RDQS_t is transmitted to the memory controller 100 through the pad 326 before the time point Td0, and the data DQ is transmitted to the memory controller 100 according to burst lengths BL0~BL15 after a pre-amble tRPRE elapses from the time point when the first strobe signal RDQS_t is transmitted. The transmission of the first strobe signal RDQS_t is completed after a post-amble tRPST elapses from the last burst length BL15. As an example, a frequency of the first strobe signal RDQS_t may be a half of a frequency of the data DQs. As another example, a frequency of the first strobe signal RDQS_t may be the same as a frequency of the data DQs.

Table 7 below explains function behavior of data mask inversion signal DMI when the link ECC engine is disabled.

| DM Function | Write DBI Function | Read DBIdc Function | DMI Signal During Write Command | Signal During Masked Write Command | DMI Signal During Read | DMI Signal During WR FIFO | DMI Signal During RD FIFO | DMI Signal During RDDQ Read Calibration | DMI Signal During MRR |
|---|---|---|---|---|---|---|---|---|---|
| Disable | Disable | Disable | Note: 1 | Note: 1, 3 | Note: 2 | Note: 1 | Note: 2 | Note: 2 | Note: 2 |
| Disable | Enable | Disable | Note: 4 | Note: 3 | Note: 2 | Note: 9 | Note: 10 | Note: 11 | Note: 2 |
| Disable | Disable | Enable | Note: 1 | Note: 3 | Note: 5 | Note: 9 | Note: 10 | Note: 11 | Note: 12 |
| Disable | Enable | Enable | Note: 4 | Note: 3 | Note: 5 | Note: 9 | Note: 10 | Note: 11 | Note: 12 |
| Enable | Disable | Disable | Note: 6 | Note: 7 | Note: 2 | Note: 9 | Note: 10 | Note: 11 | Note: 2 |
| Enable | Enable | Disable | Note: 4 | Note: 8 | Note: 2 | Note: 9 | Note: 10 | Note: 11 | Note: 2 |
| Enable | Disable | Enable | Note: 6 | Note: 7 | Note: 5 | Note: 9 | Note: 10 | Note: 11 | Note: 12 |
| Enable | Enable | Enable | Note: 4 | Note: 8 | Note: 5 | Note: 9 | Note: 10 | Note: 11 | Note: 12 |

Note:
1. DMI input signal is don't care. DMI input receivers are turned OFF.
2. DMI output drivers are turned OFF.
3. Masked Write Command is not allowed and is considered an illegal command as DM function is disabled.
4. DMI is treated as DBI and it indicates whether DRAM needs to invert the Write data received on DQs within a byte. The LPDDR5 device inverts Write data received on the DQ inputs in case DMI was sampled HIGH, or leaves the Write data non-inverted in case DMI was sampled LOW.
5. The LPDDR5 DRAM inverts Read data on its DQ outputs associated within a byte and drives DMI to HIGH when the number of '1' data bits within a given byte lane is greater than four; otherwise the DRAM does not invert the read data and drives DMI to LOW.
6. The LPDDR5 DRAM does not perform any mask operation when it receives Write command. During the Write burst associated with Write command, DMI must be driven to LOW.
7. The LPDDR5 DRAM requires an explicit Masked Write command for all masked write operations. DMI is treated as DM signal and it indicates which bit time within the burst is to be masked. When DMI is HIGH, DRAM masks that bit time across all DQs associated within a byte. All DQ input signals within a byte are don't care (either HIGH or LOW) when DMI is HIGH. When DMI is LOW, the LPDDR5 DRAM does not perform mask operation and data received on DQ input is written to the array.
8. The LPDDR5 DRAM requires an explicit Masked Write command for all masked write operations. The LPDDR5 device masks the Write data received on the DQ inputs if the total count of '1' data bits on DQ[2:7] or DQ[10:15] (for Lower Byte or Upper Byte respectively) is equal to or greater than five and DMI is LOW. Otherwise the LPDDR5 DRAM does not perform mask operation and treats it as a legal DBI pattern; DMI is treated as DBI signal and data received on DQ input is written to the array.
9. DMI is treated as a training pattern. The LPDDR5 DRAM does not perform any mask operation and does not invert Write data received on the DQ inputs.
10. DMI is treated as a training pattern. The LPDDR5 DRAM returns DMI pattern written in WR FIFO.
11. DMI is treated as a training pattern. For more details, see 4.23, RD DQ Calibration.
12. DBI may apply or may not apply during normal MRR. It's vendor specific. If read DBI is enable with MRS and vendor cannot support the DBI during MRR, DBI pin status should be low. If read DBI is enable with MRS and vendor can support the DBI during MRR, the LPDDR5 DRAM inverts Mode Register Read data on its DQ outputs associated within a byte and drives DMI to HIGH when the number of '1' data bits within a given byte lane is greater than four; otherwise the DRAM does not invert the read data and drives DMI to LOW.

Table 8 below explains function behavior of DMI when the link ECC engine is enabled.

| DM Function | Write DBI Function | Read DBIdc Function | DMI Signal During Write Command | Signal During Masked Write Command | DMI Signal During Read | DMI Signal During WR FIFO | DMI Signal During RD FIFO | DMI Signal During RDDQ Read Calibration | DMI Signal During MRR |
|---|---|---|---|---|---|---|---|---|---|
| Disable | Disable | Disable | Note: 1 | Note: 1, 3 | Note: 2 | Note: 1 | Note: 2 | Note: 2 | Note: 2 |
| Disable | Enable | Disable | Note: 4 | Note: 3 | Note: 2 | Note: 9 | Note: 10 | Note: 11 | Note: 2 |
| Disable | Disable | Enable | Note: 1 | Note: 3 | Note: 5 | Note: 9 | Note: 10 | Note: 11 | Note: 12 |
| Disable | Enable | Enable | Note: 4 | Note: 3 | Note: 5 | Note: 9 | Note: 10 | Note: 11 | Note: 12 |
| Enable | Disable | Disable | Note: 6 | Note: 7 | Note: 2 | Note: 9 | Note: 10 | Note: 11 | Note: 2 |
| Enable | Enable | Disable | Note: 4 | Note: 8 | Note: 2 | Note: 9 | Note: 10 | Note: 11 | Note: 2 |
| Enable | Disable | Enable | Note: 6 | Note: 7 | Note: 5 | Note: 9 | Note: 10 | Note: 11 | Note: 12 |
| Enable | Enable | Enable | Note: 4 | Note: 8 | Note: 5 | Note: 9 | Note: 10 | Note: 11 | Note: 12 |

Note:
1. DMI input signal is a don't care. DMI input receivers are turned OFF.
2. DMI output drivers are turned OFF.
3. Masked Write Command is not allowed and is considered an illegal command as DM function is disabled.
4. DMI is treated as DBI signal and it indicates whether DRAM needs to invert the Write data received on DQs within a byte. The LPDDR5 device inverts Write data received on the DQ inputs in case DMI was sampled HIGH, or leaves the Write data non-inverted in case DMI was sampled LOW.
5. DMI output drivers transmit the link ECC parity data for read data chunk, regardless of READ DBI on/off. The data is not applied with DBI-DC since READ DBI-DC can't be simultaneously enabled with link ECC. When Link ECC is enabled, DBI-DC for READ can't be turned on. MR3 OP[6] is required to be LOW.
6. The LPDDR5 DRAM does not perform any mask operation when it receives Write command. During the Write burst associated with Write command, DMI must be driven to LOW.
7. The LPDDR5 DRAM requires an explicit Masked Write command for all masked write operations. DMI is treated as DM signal and it indicates which bit time within the burst is to be masked. When DMI is HIGH, DRAM masks that bit time across all DQs associated within a byte. All DQ input signals within a byte are don't care (either HIGH or LOW) when DMI is HIGH. When DMI is LOW, the LPDDR5 DRAM does not perform mask operation and data received on DQ input is written to the array.
8. The LPDDR5 DRAM requires an explicit Masked Write command for all masked write operations. The LPDDR5 device masks the Write data received on the DQ inputs if the total count of '1' data bits on DQ[2:7] or DQ[10:15] (for Lower Byte or Upper Byte respectively) is equal to or greater than five and DMI is LOW. Otherwise the LPDDR5 DRAM does not perform mask operation and treats it as a legal DBI pattern; DMI is treated as DBI signal and data received on DQ input is written to the array.
9. DMI is treated as a training pattern. The LPDDR5 DRAM does not perform any mask operation and does not invert Write data received on the DQ inputs. In addition, link ECC is also not performed during WR FIFO operation, and DMI input buffer ignores the data on DMI pin during WR FIFO.
10. DMI is treated as a training pattern. The LPDDR5 DRAM returns the received pattern written in WR FIFO.
11. DMI is treated as a training pattern. For more details, see 4.28, RD DQ Calibration.
12. When DBI-DC is enabled, LPDDR5 DRAM inverts Mode Register Read data on its DQ outputs associated within a byte and drives DMI to HIGH when the number of '1' data bits within a given byte lane is greater than four; otherwise the DRAM does not invert the read data and drives DMI to LOW.

Figure 15:
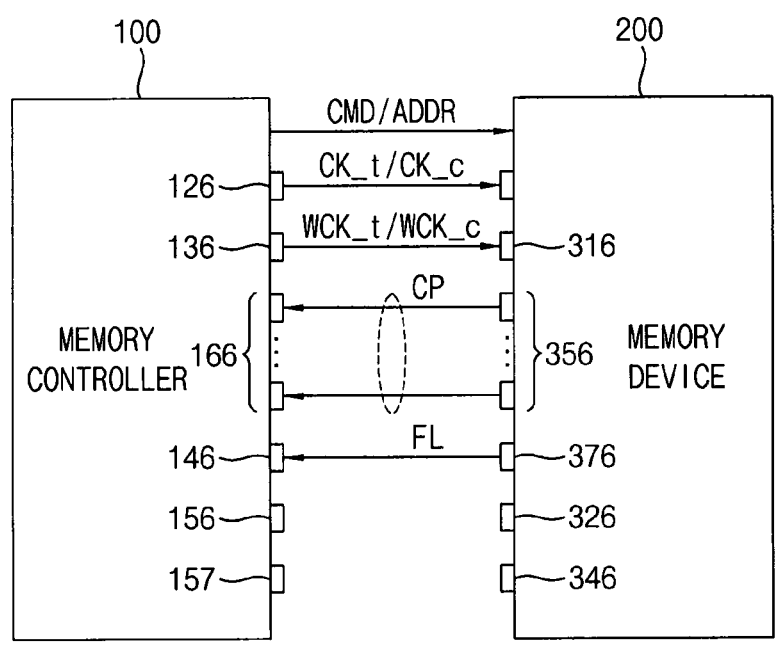
FIG. 15 illustrates an interface of the memory system of FIG. 1 in a read data calibration mode and FIG. 16 illustrates operation of the semiconductor memory device of FIG. 3 in the read data calibration mode.
Figure 16:
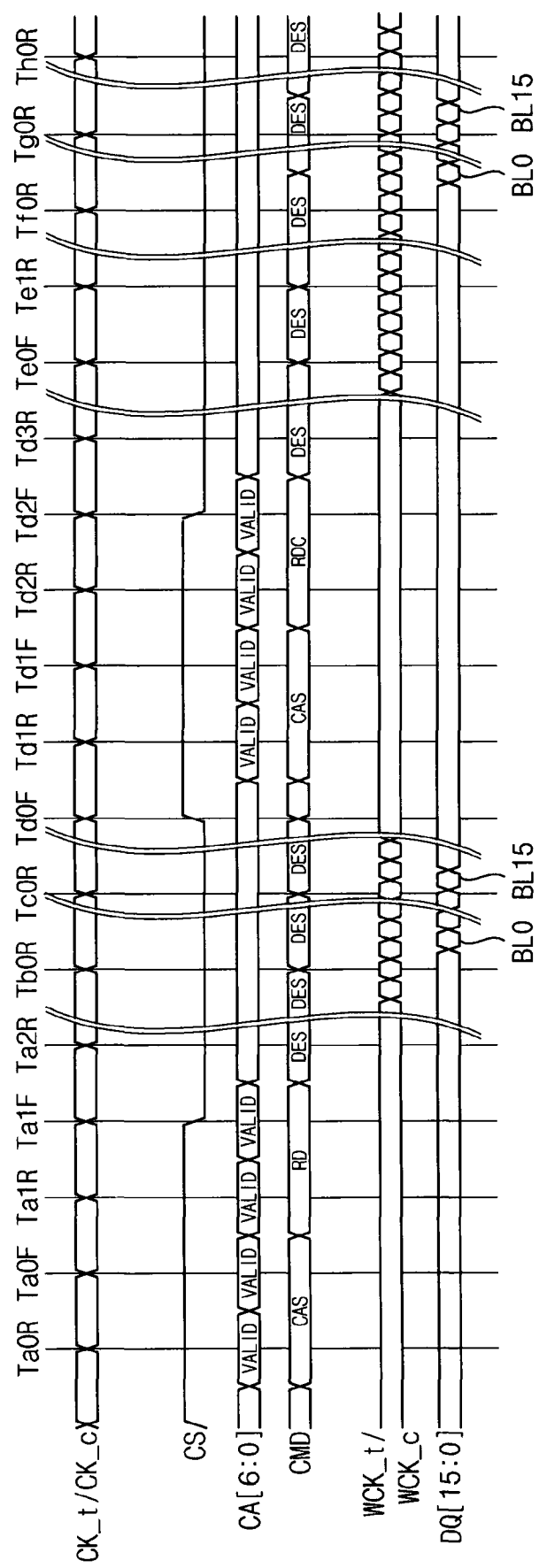

FIG. 15 illustrates an interface of the memory system of FIG. 1 in the read data calibration mode and FIG. 16 illustrates operation of the semiconductor memory device of FIG. 3 in the read data calibration mode.

Referring to FIGS. 1, 3, 15 and 16, rising edges and falling edges of the main clock signal CK_t are alternately generated at time points Ta0R~Th0R, a chip selection signal CS is alternately enabled and disable, the calibration pattern CP stored in the mode registers MR33 and MR34 is sequentially transmitted to the memory controller 100 through the data pads 356 between the time points Tb0R and Td0F and between the time points Tf0R and Th0F. In addition, the flag information FL is transmitted to the memory controller 100 through the pad 376. The flag information FL may indicate whether the calibration pattern CP is reversed according to setting of the mode registers MR30 and MR31.

FIG. 17 illustrates an example of bits output through the data pins (or, pads) in the read data calibration mode and FIG. 18 illustrates an example of bits output through the DMI pin (or pad) in the read data calibration mode.

Referring to FIG. 17, the bits output through the data pins are selectively inverted based on a logic level of the operand OP7 of the mode register MR20.

Referring to FIG. 18, the bits output through the DMI pin are selectively inverted based on a logic level of the operand OP6 of the mode register MR20.

Figure 19:
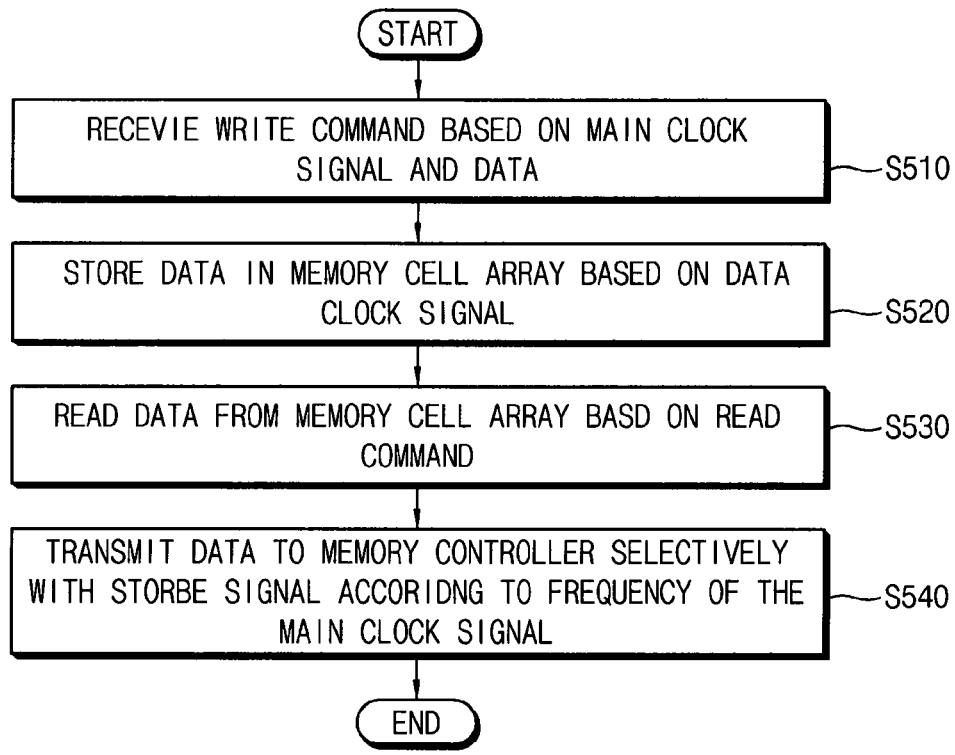
FIG. 19 is a flow chart illustrating a method of operating a semiconductor memory device according to exemplary embodiments.

FIG. 19 is a flow chart illustrating a method of operating a semiconductor memory device according to exemplary embodiments.

Referring to FIGS. 3, 4A to 4D, 5, 6A, 6B, 7 through 19, in a method of operating a semiconductor memory device 200 including a memory cell array and a control logic circuit 220 including a mode register set 222 to set an operation mode of the semiconductor memory device 200, which controls access to the memory cell array, the semiconductor memory device 200 may receive a write command CMD synchronized with a main clock signal CK_t and data DQs synchronized with a data clock signal WCK_t from a memory controller 100 (S510). The semiconductor memory device 200 may store the data in the memory cell array based on a frequency-divided data clock signal from which the data clock signal WCK_t is divided (S520).

The semiconductor memory device 200 reads data from the memory cell array in response to a read command RD and a target address ADDR received from the memory controller 100 (S530). The semiconductor memory device 200 transmits the read data to the memory controller 100 selectively with a strobe signal RDQS based on a frequency of the main clock signal CK_t (S540).

Figure 20:
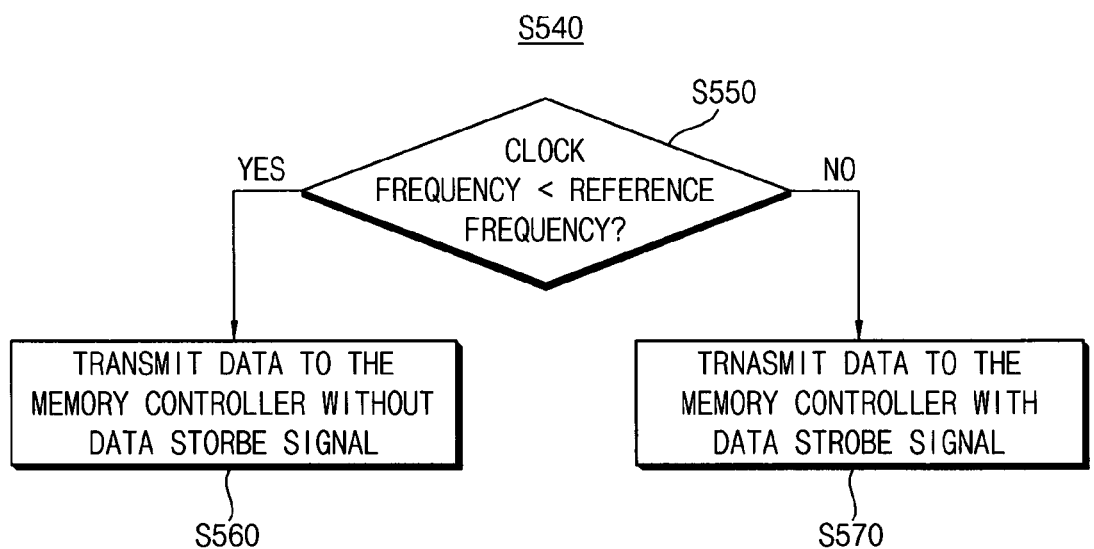
FIG. 20 is a flow chart illustrating an operation to transmit the read data to the memory controller selectively with a strobe signal in FIG. 19.

FIG. 20 is a flow chart illustrating an operation to transmit the read data to the memory controller selectively with a strobe signal in FIG. 19.

Referring to FIGS. 3, 4A to 4D, 5, 6A, 6B, 7 through 20, an I/O circuit 300 determines whether the frequency of the main clock signal CK_t is smaller than a reference frequency (S550). When the frequency of the main clock signal CK_t is smaller than the reference frequency (YES in S550), the I/O circuit 300 transmits the read data to the memory controller 100 without the strobe signal RDQS (S560). When the frequency of the main clock signal CK_t is equal to or greater than the reference frequency (NO in S550), the I/O circuit 300 transmits the read data to the memory controller 100 with the strobe signal RDQS (S570).

Figure 21:
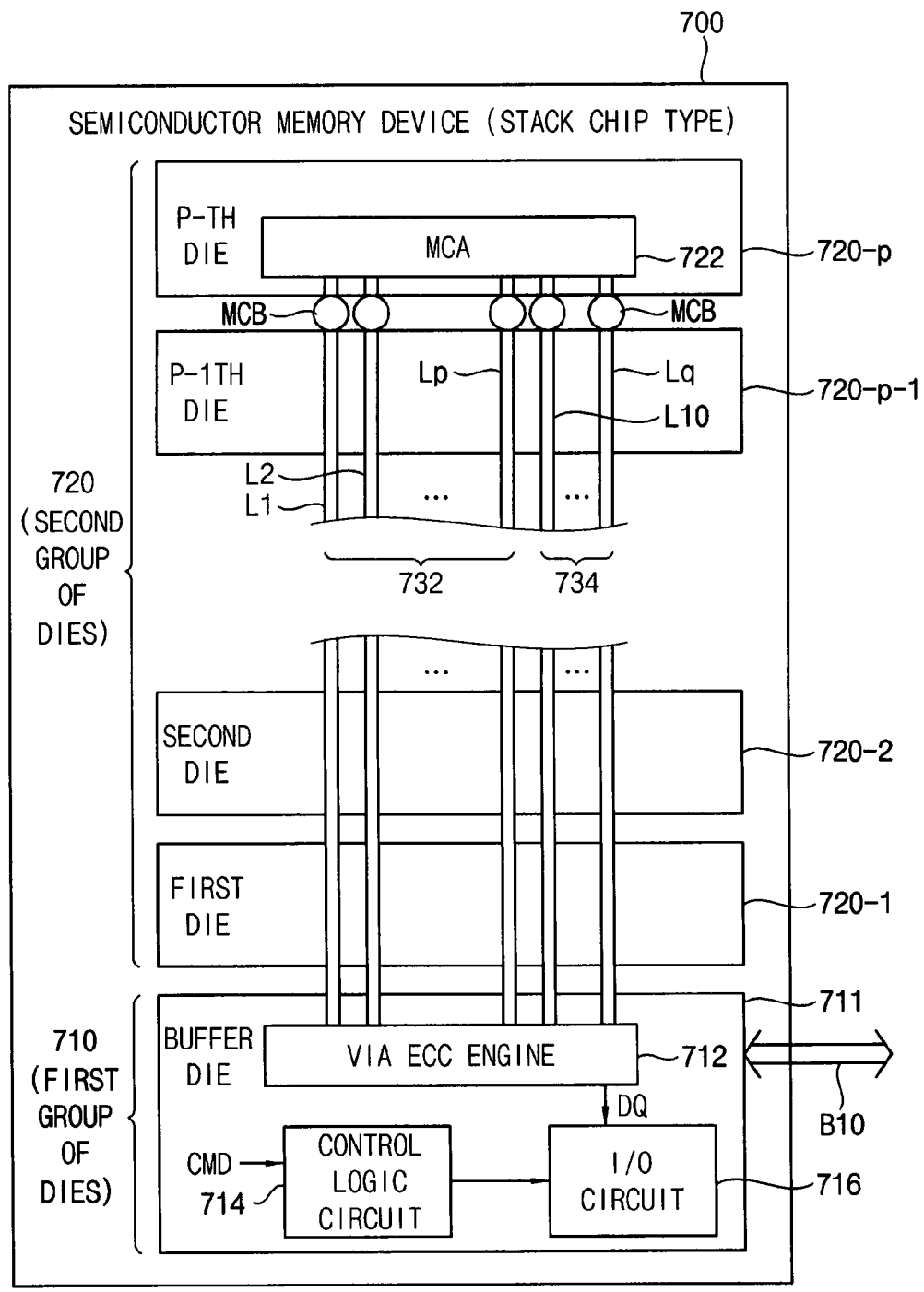
FIG. 21 is a block diagram illustrating a semiconductor memory device according to exemplary embodiments.

FIG. 21 is a block diagram illustrating a semiconductor memory device according to exemplary embodiments.

Referring to FIG. 21, a semiconductor memory device 700 may include a first group of dies 710 and a second group of dies 720

The first group of dies 710 may include at least one buffer die 711. The second group of dies 720 may include a plurality of memory dies 720-1 to 720-$p$ which are stacked on the first group of dies 710 and conveys data through a plurality of through silicon via (TSV) lines.

At least one of the memory dies 720-1 to 720-$p$ may include a memory cell array 722 that stores data.

The buffer die 711 may include an ECC engine 712 which corrects a transmission error using the transmission parity bits when a transmission error is detected from the transmission data received through the TSV liens and generates error-corrected data. The ECC engine 712 may be referred to as 'via ECC engine'. The buffer die 711 may further include a control logic circuit 714 and an I/O circuit 716. The control logic circuit 714 may employ the control logic circuit 220 in FIG. 3 and the I/O circuit 716 may employ the I/O circuit 300 of FIG. 5. Therefore, the semiconductor memory device 700 may transmit read data DQ to the memory controller selectively with a strobe signal based on a frequency of a main clock signal provided from the memory controller.

The semiconductor memory device 700 may be a stack chip type memory device or a stacked memory device which conveys data and control signals through the TSV lines. The TSV lines may be also called 'through electrodes'.

With the above description, a data TSV line group 732 which is formed at one memory die 720-$p$ may include TSV lines L1 to Lp, and a parity TSV line group 734 may include 8 TSV lines L10 to Lq.

The TSV lines L1 to Lp of the data TSV line group 732 and the parity TSV lines L10 to Lq of the parity TSV line group 734 may be connected to micro bumps MCB which are correspondingly formed among the memory dies 720-1 to 720-$p$.

The semiconductor memory device 700 may have a three-dimensional (3D) chip structure or a 2.5D chip structure to communicate with the host through a data bus B10. The buffer die 711 may be connected with the memory controller through the data bus B10.

The ECC engine 712, denoted as the via ECC engine, may determine whether a transmission error occurs at the transmission data received through the data TSV line group 732, based on the transmission parity bits received through the parity TSV line group 734. When a transmission error is detected, the second type ECC engine 712 may correct the transmission error on the transmission data using the transmission parity bits. When the transmission error is uncorrectable, the second type ECC engine 712 may output information indicating occurrence of an uncorrectable data error.

Figure 22:
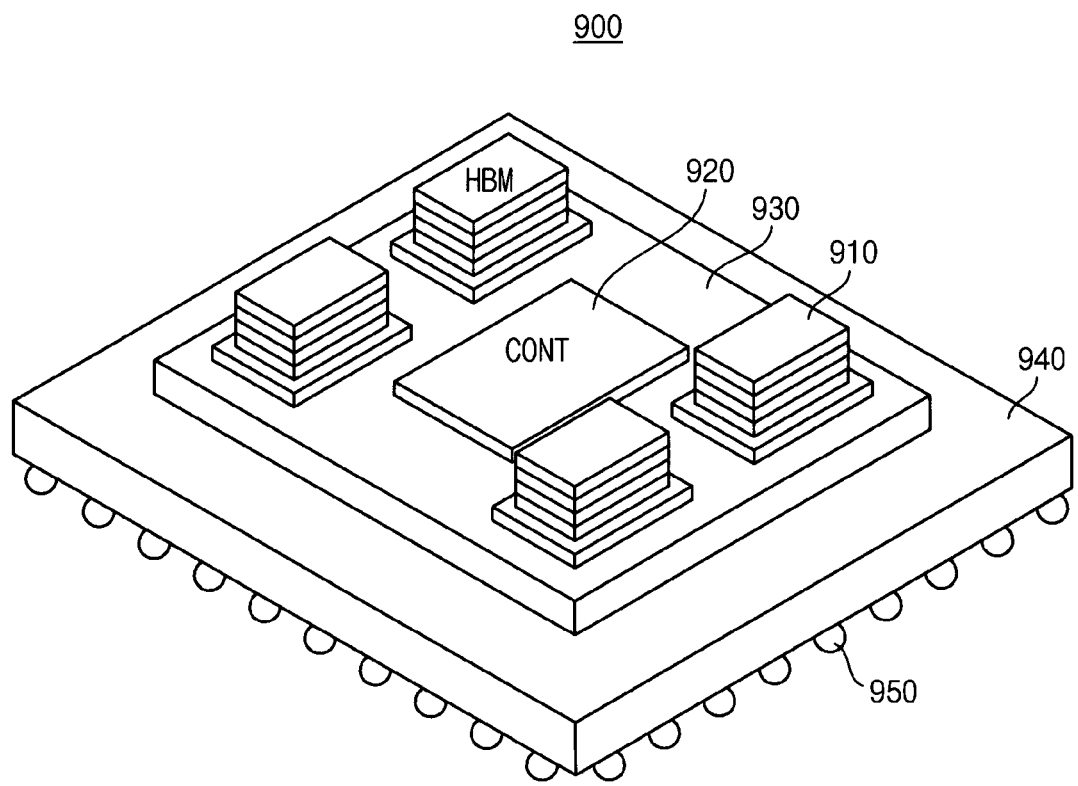
FIG. 22 is a configuration diagram illustrating a semiconductor package including the stacked memory device according to exemplary embodiments.

FIG. 22 is a configuration diagram illustrating a semiconductor package including the stacked memory device according to exemplary embodiments.

Referring to FIG. 22, a semiconductor package 900 may include one or more stacked memory devices 910 and a memory controller 920.

The stacked memory devices 910 and memory controller 920 may be mounted on an interposer 930, and the interposer on which the stacked memory device 10 and memory controller 920 are mounted may be mounted on a package substrate 940.

The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and the buffer die may include the control logic circuit and the I/O circuit described above.

The plurality of stacked memory devices 910 may be mounted on the interposer 930, and memory controller 920 may communicate with the plurality of stacked memory devices 910.

For example, each of the stacked memory devices 910 and memory controller 920 may include a physical region, and communication may be performed between the stacked memory devices 910 and memory controller 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Here, the interposer 930 may include an embedded multi-die interconnect bridge (EMIB) which is an organic or non-TSV manner having a TSV form or a printed circuit board (PCB) form.

Accordingly, a semiconductor memory device and a memory system using a main clock signal and a data clock signal may support a strobe mode in which a single-ended strobe signal or a differential strobe signal is used, and a performance of the semiconductor memory device may be enhanced.

The present disclosure may be applied to systems using LPDDR5 SDRAM. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a semiconductor memory device including a plurality of pins configured to transfer data and signals from/to an outside of the semiconductor memory device, a memory cell array and a control logic circuit configured to control access to the memory cell array, the control logic circuit including a mode register set configured to set an operation mode of the semiconductor memory device, the method comprising:

receiving a write command and data from the outside of the semiconductor memory device, the write command being synchronized with a main clock signal and the data being synchronized with a data clock signal, the main clock signal and the data clock signal being received from the outside of the semiconductor memory device;

storing the data in the memory cell array based on a frequency-divided data clock signal which is divided from the data clock signal;

reading data from the memory cell array in response to a read command and a target address received from the outside of the semiconductor memory device;

transmitting the read data to the outside of the semiconductor memory device selectively with a strobe signal generated based on a frequency of the main clock signal; and setting a strobe mode of the semiconductor memory device based on a comparison of the frequency of the main clock signal and a reference frequency by the mode register set.

2. The method of claim 1, wherein, when the frequency of the main clock signal is greater than the reference frequency and the control logic circuit receives a command and an address from the outside of the semiconductor memory device, the control logic circuit generates a strobe mode signal to designate the strobe mode of the semiconductor memory device as one of a first strobe mode and a second strobe mode.

3. The method of claim 2, wherein, when the strobe mode designates the first strobe mode, the semiconductor memory device is configured to transmit the read data along with a single-ended strobe signal to the outside of the semiconductor memory device.

4. The method of claim 3, wherein the single-ended strobe signal is one of a first strobe signal and a second strobe signal, which the first and second strobe signals have a reverse phase with respect to each other.

5. The method of claim 3, wherein a frequency of the single-ended strobe signal is a half of a frequency of the read data.

6. The method of claim 2, wherein, when the strobe mode designates the second strobe mode, the semiconductor memory device is configured to transmit the read data along with a differential strobe signal to the outside of the semiconductor memory device.

7. The method of claim 6, wherein the differential strobe signal includes a first strobe signal and a second strobe signal, which the first and second strobe signals have a reverse phase with respect to each other.

8. The method of claim 7, the method further comprises:

transmitting the first strobe signal to the outside of the semiconductor memory device through a first strobe pin of the plurality of pins; and transmitting the second strobe signal to the outside of the semiconductor memory device through a second strobe pin of the plurality of pins.

9. The method of claim 7, wherein a frequency of the differential strobe signal is the same as a frequency of the read data.

10. The method of claim 2, wherein the mode register set includes at least first through forty-third mode registers, and wherein the twenty-first mode register designates the strobe mode and a read data calibration mode.

11. The method of claim 10, wherein, when the twenty-first mode register designates the read data calibration mode, the method further comprises:

sequentially transmitting calibration patterns stored in the thirty-fourth mode register and the thirty-fifth mode register through data pins of the plurality of pins.

12. A semiconductor memory device comprising:

a plurality of pads disposed on a substrate;

a memory cell array configured to store write data which is synchronized with a data clock signal received from an outside of the semiconductor memory device in a write operation of the semiconductor memory device;

a control logic circuit configured to control access to the memory cell array in response to a command and an address received from the outside of the semiconductor memory device, the command and the address being synchronized with a main clock signal received from the outside of the semiconductor memory device, the control logic circuit including a mode register set configured to set an operation mode of the semiconductor memory device; and an input/output (I/O) circuit configured to transmit read data from the memory cell array to the outside of the semiconductor memory device selectively with a strobe signal generated based on a frequency of the main clock signal, wherein the mode register set is configured to set a strobe mode of the semiconductor memory device based on a comparison of the frequency of the main clock signal and a reference frequency.

13. The semiconductor memory device of claim 12, wherein, when the frequency of the main clock signal is greater than the reference frequency and the control logic circuit receives the command and the address from the outside of the semiconductor memory device, the control logic circuit generates a strobe mode signal to designate the strobe mode of the semiconductor memory device as one of a first strobe mode and a second strobe mode.

14. The semiconductor memory device of claim 13, wherein the I/O circuit is configured to transmit the read data to the outside of the semiconductor memory device with a single-ended strobe signal when the strobe mode signal designates the first strobe mode, wherein single-ended strobe signal is one of a first strobe signal and a second strobe signal, which the first and second strobe signals have a reverse phase with respect to each other, and wherein a frequency of the single-ended strobe signal is a half of a frequency of the read data.

15. The semiconductor memory device of claim 13, wherein the I/O circuit is configured to transmit the read data to the outside of the semiconductor memory device with a differential strobe signal when the strobe mode signal designates the second strobe mode, wherein the differential strobe signal includes a first strobe signal and a second strobe signal, which the first and second strobe signals have a reverse phase with respect to each other, and wherein a frequency of the differential strobe signal is the same as a frequency of the read data.

16. The semiconductor memory device of claim 13, wherein the mode register set includes at least first through forty-third mode registers, wherein the twenty-first mode register designates the strobe mode and a read data calibration mode, and wherein, when the twenty-first mode register designates the read data calibration mode, the semiconductor memory device is configured to sequentially transmit calibration patterns stored in the thirty-fourth mode register and the thirty-fifth mode register through data pads of the plurality of pads.

17. The semiconductor memory device of claim 12, further comprising:

a link parity generator configured to selectively generate link parity to correct transmission error which occurs during the read data is transmitted to the outside of the semiconductor memory device.

18. The semiconductor memory device of claim 17, wherein, when the control logic circuit activates the link parity generator, the I/O circuit is configured to transmit the link parity to the outside of the semiconductor memory device through a data mask inversion (DMI) pad of the plurality of pads, and wherein, when the control logic circuit deactivates the link parity generator, the I/O circuit is configured to transmit information to the outside of the semiconductor memory device through the DMI pad, the information indicating whether the read data is inverted.

19. The semiconductor memory device of claim 12, wherein, when a write command received from the outside of the semiconductor memory device designates a masked write operation, the I/O circuit is configured to store a portion of the write data in the memory cell array based on information received through a data mask inversion (DMI) pad of the plurality of pads.

20. The semiconductor memory device of claim 12, further comprising:

at least one buffer die; and a plurality of memory dies which are stacked on the buffer die, configured to convey data through a plurality of through silicon via (TSV) lines, wherein at least one of the plurality of memory dies includes the memory cell array and the buffer die includes the I/O circuit.

* * * * *